United States Patent
Oda et al.

(10) Patent No.: US 8,415,977 B1
(45) Date of Patent: Apr. 9, 2013

(54) SEMICONDUCTOR INTEGRATED CIRCUIT

(75) Inventors: Masato Oda, Kanagawa (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/469,930

(22) Filed: May 11, 2012

(51) Int. Cl.
*H03K 19/177* (2006.01)

(52) U.S. Cl. .................... 326/41; 326/38; 326/47

(58) Field of Classification Search ........... 326/37–49, 326/101

See application file for complete search history.

(56) References Cited

U.S. PATENT DOCUMENTS

| 7,253,662 | B2 * | 8/2007 | Tsai et al. .............. 326/101 |
| 7,411,267 | B2 * | 8/2008 | Yamawaki et al. ...... 257/499 |
| 7,821,294 | B2 * | 10/2010 | Lichtensteiger et al. ... 326/38 |

FOREIGN PATENT DOCUMENTS

JP 2008-47708 2/2008

OTHER PUBLICATIONS

Tuan, T. et al., "A 90-nm Low-Power FPGA for Battery-Powered Applications," IEEE Transactions on Computer-Aided Design of Integrated Circuits and Systems, vol. 26, No. 2, pp. 296-300, (2007).

* cited by examiner

*Primary Examiner* — James H Cho
(74) *Attorney, Agent, or Firm* — Finnegan, Henderson, Farabow, Garrett & Dunner, L.L.P.

(57) ABSTRACT

A semiconductor integrated circuit in an embodiment includes a first circuit group that includes at least one first logic block and a second circuit group that includes second logic blocks. The number of the second logic blocks is greater than the number of the first logic blocks. The first circuit group includes a first switching block and a first power control circuit. The first power control circuit commonly controls a start of power supply and a stop of the power supply for the first logic block and the first switching block. The second circuit group includes second switching blocks and a second power control circuit. The second power control circuit commonly controls a start of power supply and a stop of the power supply for the second logic blocks and the second switching blocks.

9 Claims, 17 Drawing Sheets

SEMICONDUCTOR INTEGRATED CIRCUIT

CROSS-REFERENCE TO RELATED APPLICATION(S)

This application is based upon and claims the benefit of priority from Japanese Patent Application No. 2011-257559, filed on Nov. 25, 2011; the entire contents of which are incorporated herein by reference.

FIELD

Embodiments described herein relate generally to a semiconductor integrated circuit.

BACKGROUND

Conventionally, as an example of a semiconductor integrated circuit (IC) that can implement an arbitrary logic function, FPGA (field-programmable gate array) has been known. In a general FPGA, a plurality of tiles is arranged in a matrix pattern, each having a logic block that can implement a specific logic function and a switching block that includes a plurality of switches switching among connections of a plurality of wirings used for connecting logic blocks in accordance with programmable control data. By supplying (writing) the control data to each switching block from an outside, a variety of logic functions can be implemented.

Although the FPGA can implement a variety of logic functions, not all the tiles are used in most cases when each logic function is implemented, and accordingly, it is preferable that the supply of power to unused tiles is stopped.

DETAILED DESCRIPTION

In an embodiment, a semiconductor integrated circuit includes: a first circuit group configured to include at least one first logic block; a second circuit group configured to include second logic blocks, the number of which is greater than the number of the first logic blocks; and an input-output unit configured to input input data to the first logic block or the second logic blocks and to output output data from the first logic block or the second logic blocks to the outside. The first circuit group includes: a first switching block configured to include a switch switching, in accordance with programmable control data, a connection of a wiring used for at least one of a connection of the first logic block with the input-output unit or a connection of a second logic block with the input-output unit; a connection between the first logic blocks; and a connection between the first logic block and the second logic block; and a first power control circuit configured to commonly control a start of power supply and a stop of the power supply with respect to the first logic block and the first switching block. The second circuit group includes: a second switching block configured to include a switch switching, in accordance with programmable control data, a connection of a wiring used for at least one of a connection of the first logic block with the input-output unit or a connection of the second logic block with the input-output unit; a connection between the second logic blocks; and a connection between the first logic block and the second logic block; and a second power control circuit configured to commonly control a start of power supply and a stop of the power supply with respect to the second logic blocks and the second switching block.

Hereinafter, semiconductor integrated circuits according to embodiments will be described in detail with reference to the accompanying drawings. In addition, in the following embodiments, although an FPGA will be described as an example of the semiconductor integrated circuit, the semiconductor integrated circuit is not limited thereto.

First Embodiment

Figure 1:
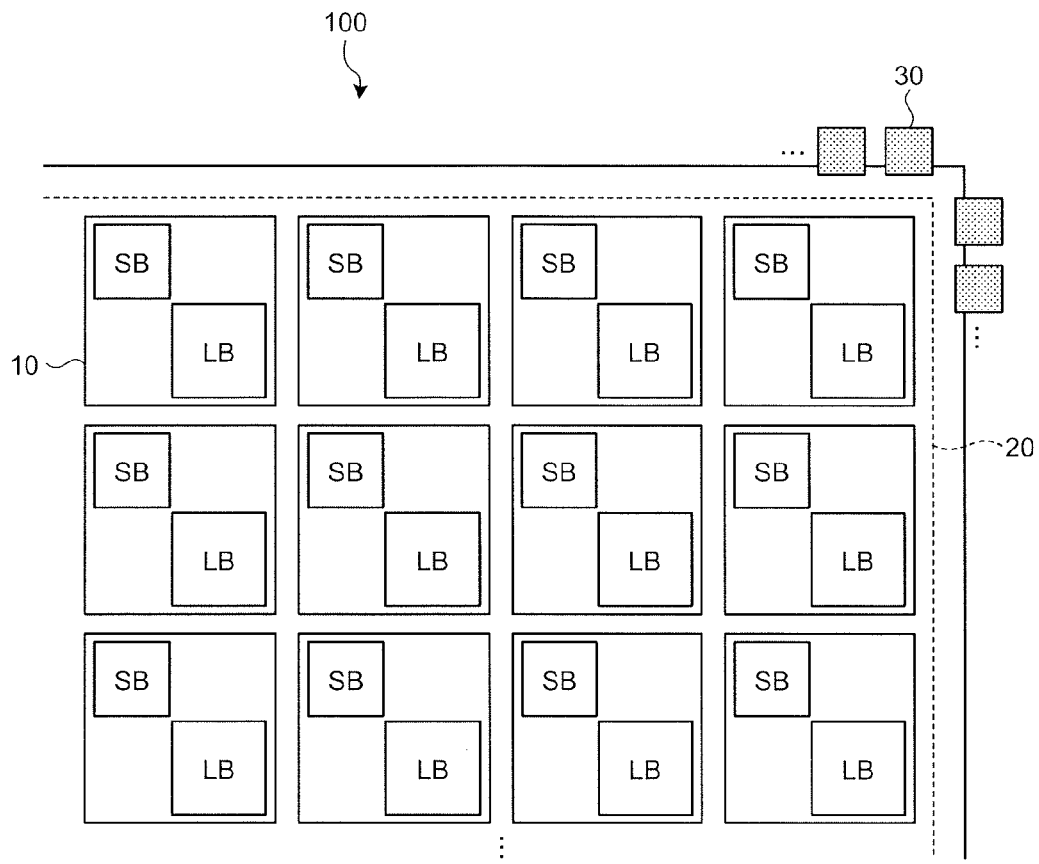
FIG. 1 is a diagram illustrating a schematic configuration example of an FPGA according to a first embodiment.

FIG. 1 is a diagram illustrating a schematic configuration example of an FPGA 100 according to a first embodiment. As illustrated in FIG. 1, the FPGA 100 includes an array unit 20 in which a plurality of tiles 10 are arranged in a matrix pattern and a plurality of input-output units (I/O) 30 that are arranged so as to enclose the array unit 20.

Each tile 10 according to this embodiment is a unit that can implement a specific logic function and includes a logic block LB and a switching block SB. The logic block LB includes at least one logic operation circuit, and the specific logic function is implemented through a logic operation of the logic operation circuit. The logic functions that can be implemented by the tiles 10 can be individually set for each tile 10.

The switching block SB includes a plurality of switches that are switched among connections of a plurality of wirings (not illustrated in the figure) used for connecting the logic block LB and the input-output unit 30 or the logic blocks LBs in accordance with control data that can be programmed (that can be arbitrarily set). For example, each switch is configured by a field effect transistor, and the gate may be connected to a memory that stores bit data (control data) written from the outside. In such a case, the bit data stored in the memory is rewritable, and each switch is switched between On/Off in accordance with the bit data written in the memory.

Each of the plurality of input-output units 30 has a function of inputting input data to the logic block LB and a function of outputting output data output from the logic block LB to the outside.

Figure 2:
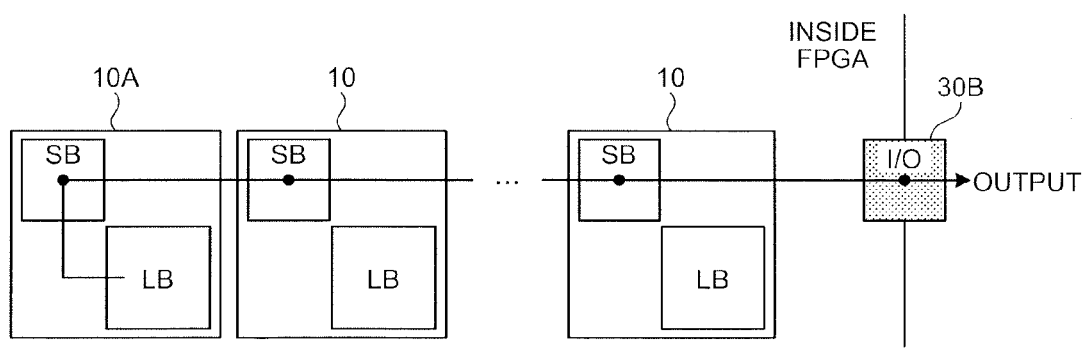
FIG. 2 is a diagram illustrating an example of a path from a logic block to an input-output unit, according to the first embodiment.

Here, according to the structure of the FPGA 100, in order for output data output from the logic block LB of a certain tile 10 to arrive at the input-output unit 30, since the output data passes through all the switching blocks SBs that are interposed between the tile 10 and the input-output unit 30, for example, as illustrated in FIG. 2, in a case where a tile 10A that is located far from the input-output unit 30B that outputs the output data is arranged and wired so as to be used, the amount of delay in data transfer increases. Accordingly, the tile 10 located at a position close to the input-output unit 30 (hereinafter, referred to as a "used input-output unit 30") that inputs input data or outputs output data is arranged and wired so as to be used.

Accordingly, the closer a tile 10 is located to the used input-output unit 30, the higher the value of the operation probability representing the possibility to be operated is. The operation probability of the tile 10 can be represented by the following Equation (1).

$$f(D)=1/[\exp\{(D-\mu)/C\}+1] \quad (1)$$

In Equation (1) described above, f(D) represents the operation probability of the tile 10 that is arranged at a position located at a distance of D from the used input-output unit 30. In addition, μ represents a distance from the input-output unit 30 in a case where the logic blocks LB are used in the order of closeness to the used input-output unit 30. Furthermore, μ is a fixed value (constant) that is determined based on the size (for example, the number of tiles 10) of an FPGA (for example, an FPGA including tiles 10 of 150×150 or the like) and the logic used by a user. On the other hand, D described above is a variable of the function acquiring the operation probability f(D) of the tile 10, and the value of the operation probability f(D) is set to be changed in accordance with the variable D. In addition, C is a constant that represents the degree of easiness in separating the logic block LB from the used input-output unit 30. In other words, the operation probability f(D) follows the Fermi-Dirac statistical distribution. In addition, the operation probability of the tile 10 can be regarded as representing the possibility of the operation of the logic block LB included in the tile 10.

Figure 3:
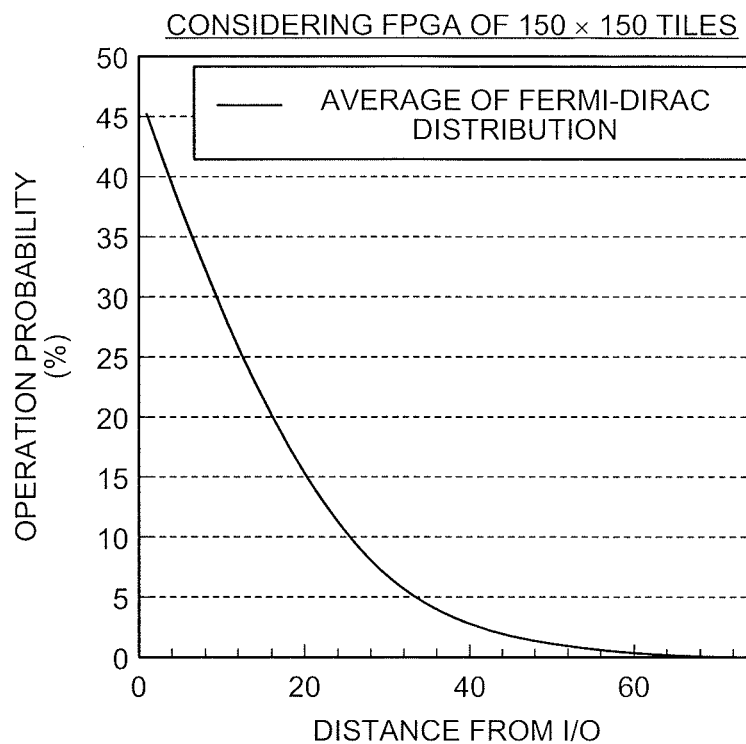
FIG. 3 is a diagram illustrating an average value of a Fermi-Dirac statistical distribution.

FIG. 3 is a diagram illustrating an average value of a Fermi-Dirac statistical distribution in a case where the width of the FPGA is configured to be 150 tiles for 20 benchmark circuits. It is assumed that the logic block disposed inside each tile is configured by a four-input look-up table (LUT). As can be understood from FIG. 3, the shorter the distance of a tile from the used input-output unit (I/O) is, the larger the value of the operation probability is.

As above, in the FPGA, the closer to the input-output unit 30 the tile 10 is located, the larger the value of the operation probability is. In an area, which has a high operation probability, of the array unit 20 having the tiles 10 arranged in a matrix pattern therein, it is understood that a plurality of tiles 10 included in the area are simultaneously used, and accordingly, it is considered that a common power control circuit may be arranged for the plurality of the tiles 10.

Figure 4:
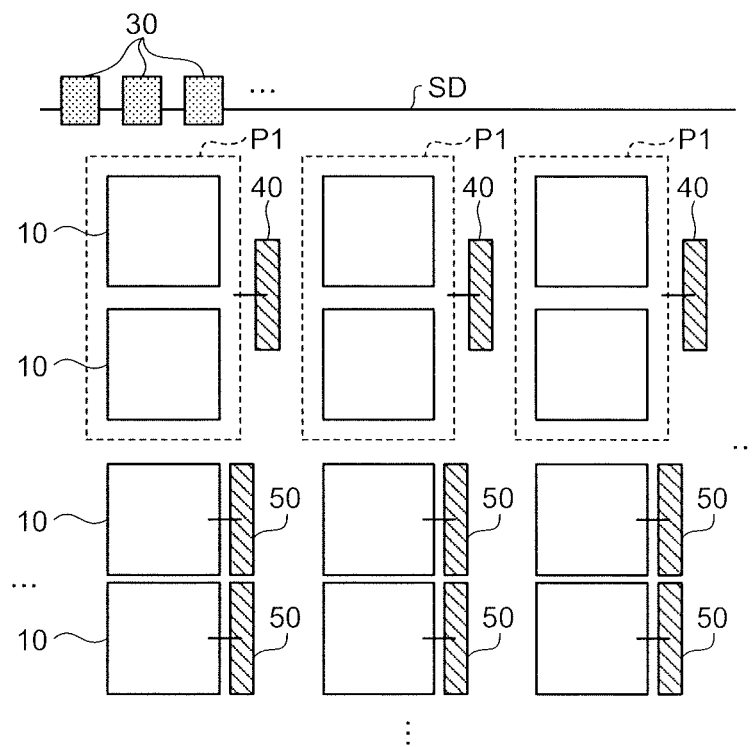
FIG. 4 is a diagram illustrating an example of the arrangement of a power control circuit according to the first embodiment.

Thus, in this embodiment, as illustrated in FIG. 4, the tiles 10 arranged at positions near the side SD configured by a plurality of used input-output units 30 are grouped for every plurality of tiles 10. In the example illustrated in FIG. 4, in a direction (column direction) perpendicular to the extending direction (row direction) of the side SD, one set P1 is configured by first and second tiles 10 when counted from the side close to the side SD. For each set P1, a common power control circuit 40 that controls the supply and the stop of power to two tiles 10 belonging to the set P1 is disposed. On the other hand, for tiles 10 other than the tiles 10 included in the sets P1, power control circuits 50 that control the supply and the stop of power to the tiles 10 are individually disposed. From another perspective, it can be understood that, the other tiles 10 arranged at positions located farther from the side SD than the tiles 10 included in the set P1 are grouped as a set for each tile 10, and for each grouped set, the power control circuit 50 that control the supply and the stop of power to one tile 10 belonging to the set is individually disposed.

In other words, it can be understood that the FPGA 100 according to this embodiment includes: a first circuit group (in this example, the unit that is grouped for each one tile 10, in other words, one tile 10) that includes at least one logic block LB ("first logic block"); and a second circuit group (in this example, the set P1) that includes logic blocks LBs ("second logic blocks") and that is arranged at positions closer to the used input-output unit 30 than the first circuit group. The number of the second logic blocks is greater than the number of the first logic blocks.

The first circuit group includes: a first switching block (in this example, the switching block SB that is included in one tile 10) configured to include a switch (one or more switches) switching, in accordance with programmable control data, a connection of a wiring (one or more wirings) that is used for at least one of a connection of the first logic block with the input-output unit 30 or a connection of a second logic block with the input-output unit 30, a connection between the first logic blocks, and a connection between the first logic block and the second logic block; and a first power control circuit (in this example, the power control circuit 50) configured to commonly control a start of power supply and a stop of the power supply with respect to the first logic block (in this example, the logic block LB included in one tile 10) and the first switching block that are included in the first circuit group. In addition, it can be understood that the second circuit group includes: a second switching block (in this example, the switching block SB that is included in each one of two tiles 10 included in the set P1) that includes a switch (one or more switches) switching, in accordance with programmable control data, a connection of a wiring (one or more wirings) that is used for at least one of a connection of the first logic block with the input-output unit 30 or a connection of the second logic block with the input-output unit 30, a connection between the second logic blocks, and a connection between the first logic block and the second logic block; and a second power control circuit (in this example, the power control circuit 40) configured to commonly control a start of power supply and a stop of the power supply with respect to the second logic block (in this example, the logic blocks LB included in each one of two tiles 10 that are included in the set P1) and the second switching block that are included in the second circuit group.

Figure 5:
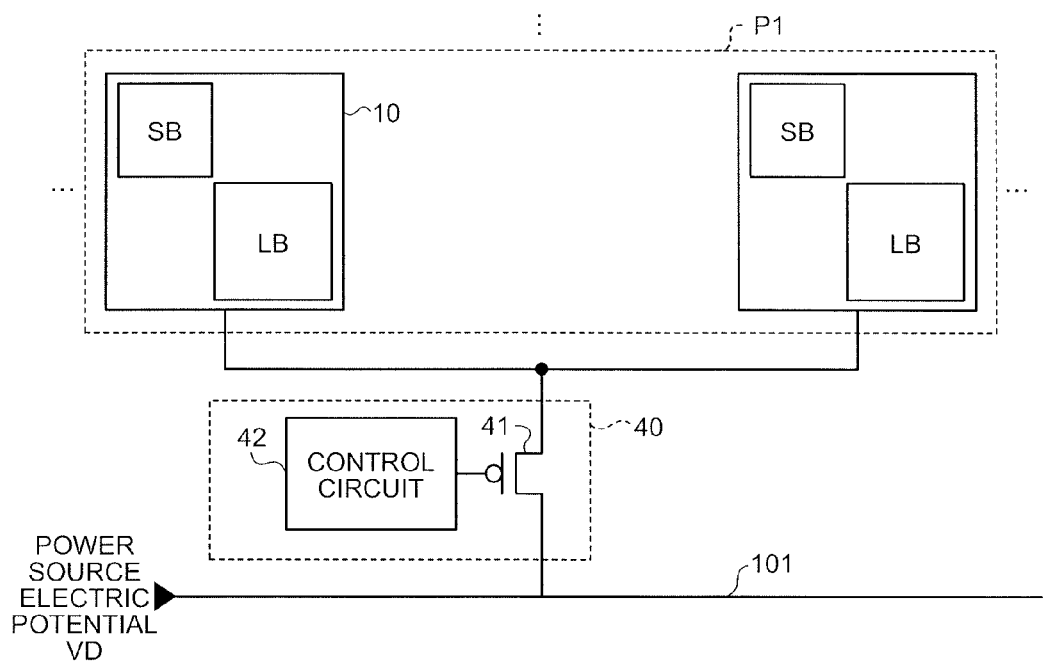
FIG. 5 is a diagram illustrating an example of the configuration of the power control circuit according to the first embodiment.

FIG. 5 is a diagram illustrating an example of the configuration of the power control circuit 40. Here, although the power control circuit 40 (this can be considered as the power control circuit 40 included in one set P1) disposed in correspondence with one set P1 will be described as an example, the power control circuits 40 disposed in correspondence with the other sets P1 have the same configuration. As illustrated in FIG. 5, the power control circuit 40 includes a switching element 41 and a control circuit 42. The switching element 41 is arranged between a power supply line 101 through which a power source electric potential VD is supplied and the set P1. In the example illustrated in FIG. 5, the switching element 41 is configured by a P channel-type field effect transistor (P-type MOSFET). The gate of the switching element 41 is connected to the control circuit 42, and the switching element 41 is switched between On and Off in accordance with a switching control signal that is supplied from the control circuit 42. For example, the switching control signal is one-bit digital data, and the switching element 41 may be configured to be switched between On and Off in accordance with the digital data. In addition, the control circuit 42 may be any unit that can control the On and Off of the switching element 41, and the configuration thereof is arbitrary. For example, the control circuit 42 may be configured by a memory element that can store a switching control signal written from the outside.

In a case where the switching element 41 transits to the On state, power supply paths from the power supply line 101 to two tiles 10 included in the set P1 are formed, and the two tiles 10 are supplied with the power source electric potential VD. On the other hand, in a case where the switching element 41 transits to the Off state, the power supply paths from the power supply line 101 to the two tiles 10 included in the set P1 are not formed, and accordingly, the power source electric potential VD is not supplied to the two tiles 10. Although the basic configuration of the power control circuits 50 is similar to that of the power control circuit 40 illustrated in FIG. 5, the power control circuits 50 are individually disposed for each tile 10 other than the tiles 10 included in the set P1, and accordingly, the switching elements and the control circuits corresponding to the number of the other tiles 10 are necessary.

As described above, according to this embodiment, the tiles 10 arranged at positions close to the used input-output unit 30 (the side SD) are grouped as sets for each two tiles 10, the common power control circuit 40 is disposed for each unit (for the set P1) grouped as the set; and accordingly, compared to a case where the power control circuits 50 are individually disposed for all the tiles 10, the circuit scale can be decreased. On the other hand, for the tiles 10 arranged at positions located far from the used input-output unit 30, in other words, the tiles 10 having low possibilities of being used (the values of the operation probability are small), in a case where the unit for controlling the supply and the stop of power is small; the effect of decreasing power is higher than that in a case where a common power control circuit is arranged for a plurality of the tiles 10. In this embodiment, for the tiles 10 arranged at positions located farther from the used input-output unit 30 than the tiles 10 included in the set P1, the power control circuits 50 are individually disposed, and accordingly, the supply and the stop of power can be controlled in units of each tile 10. In other words, the unit for controlling the supply and the stop of power can be decreased, whereby the effect of decreasing the power is larger than that of a case where a common control circuit is disposed for a plurality of the tiles 10.

Modified Example of First Embodiment

Figure 6:
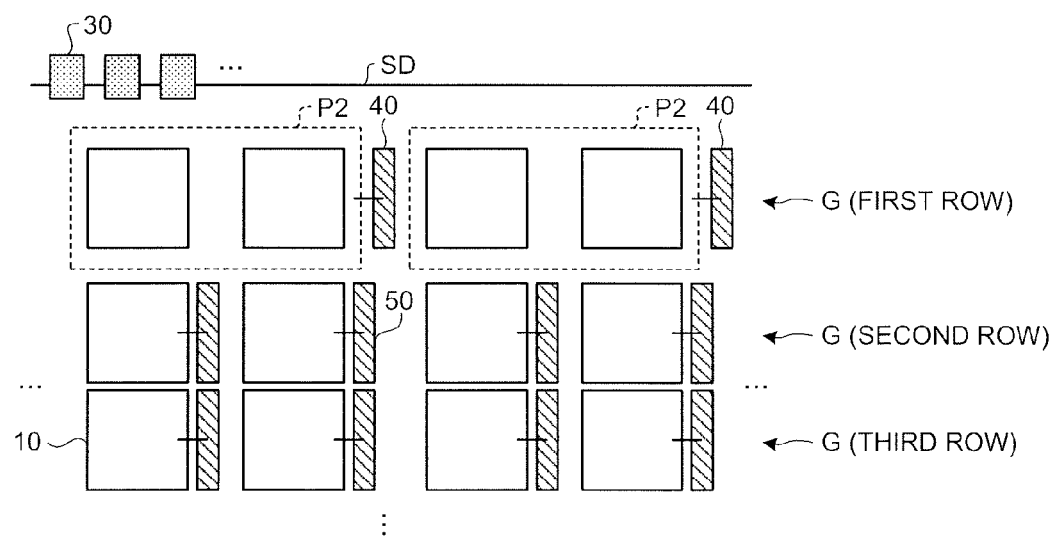
FIG. 6 is a diagram illustrating an example of the arrangement of a power control circuit according to a modified example of the first embodiment.

In the above-described array unit 20, it can be understood that sets G, each configured by a plurality of tiles 10 arranged to be parallel to the extending direction (row direction) of the side SD, are arranged in a parallel manner. As illustrated in FIG. 6, for a plurality of tiles 10 included in the set G of the first row when counted from the side close to the side SD, one set P2 may be configured for each two tiles 10. In an example illustrated in FIG. 6, a common power control circuit 40 is disposed for each set P2. On the other hand, for tiles 10 other than the plurality of tiles 10 included in the set G of the first row, power control circuits 50 are individually disposed.

Second Embodiment

Next, a second embodiment will be described. In the second embodiment, while the number of tiles 10 belonging to a set formed close to the used input-output unit 30 (side SD) is larger than two, which is different from the above-described first embodiment, the other configurations are same to those of the first embodiment. Hereinafter, the same reference numeral is assigned to each part that is common to the first embodiment, and the description thereof will not be repeated as is appropriate.

Figure 7:
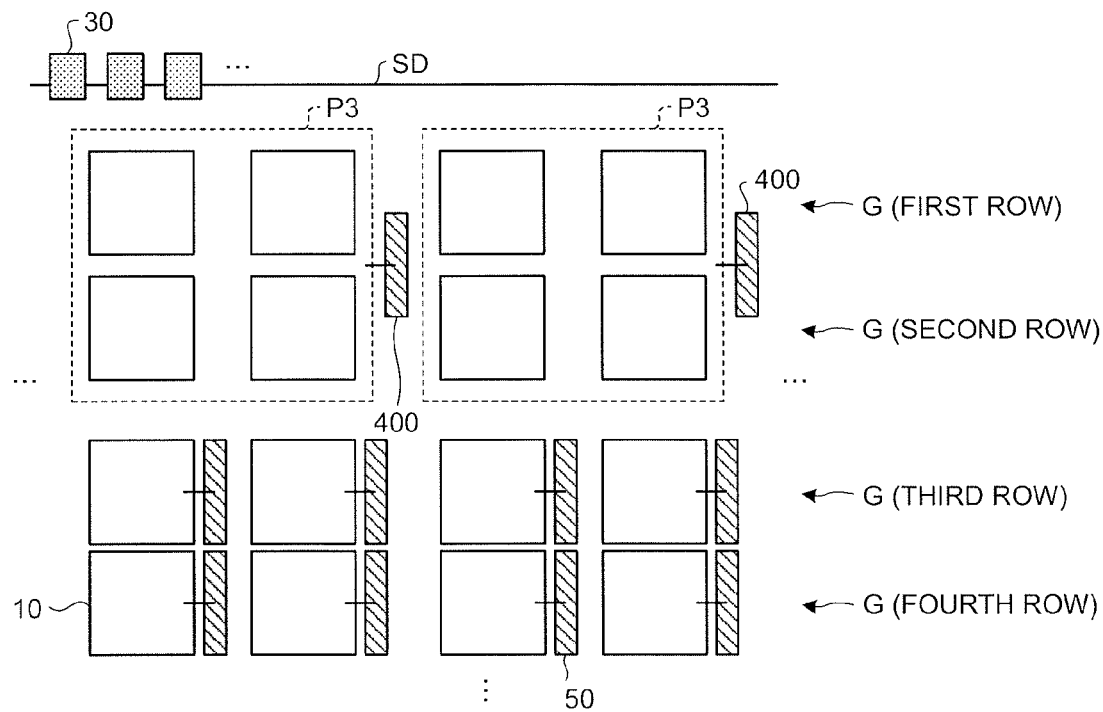
FIG. 7 is a diagram illustrating an example of the arrangement of a power control circuit according to a second embodiment.

As described above, it can be understood that the sets G each configured by a plurality of tiles 10 arranged to be parallel to the extending direction (row direction) of the side SD are arranged in the array unit 20 in a parallel manner. In this embodiment, as illustrated in FIG. 7, for a plurality of tiles 10 included in each set G of the first row and the second row when counted from the side close to the side SD, one set P3 is configured for each four tiles 10 of 2 rows×2 columns. In addition, a common power control circuit 400 is disposed for each set P3. While the basic configuration of the power control circuit 400 is similar to that of the power control circuit 40 illustrated in FIG. 5, the power control circuit 400 controls the supply and the stop of the power source electric potential VD to each one of four tiles 10 included in the set P3. On the other hand, for tiles 10 other than the tiles 10 included in the respective sets G of the first row and the second row, power control circuits 50 are individually disposed.

In this embodiment, tiles 10 arranged at positions located close to the used input-output unit 30 (the side SD) are grouped as a set for each four tiles 10, the common power control circuit 400 is disposed for each unit grouped as the set (for each set P3), and accordingly, the circuit scale can be further decreased, compared to that of the above-described first embodiment.

Modified Example of Second Embodiment

Figure 8:
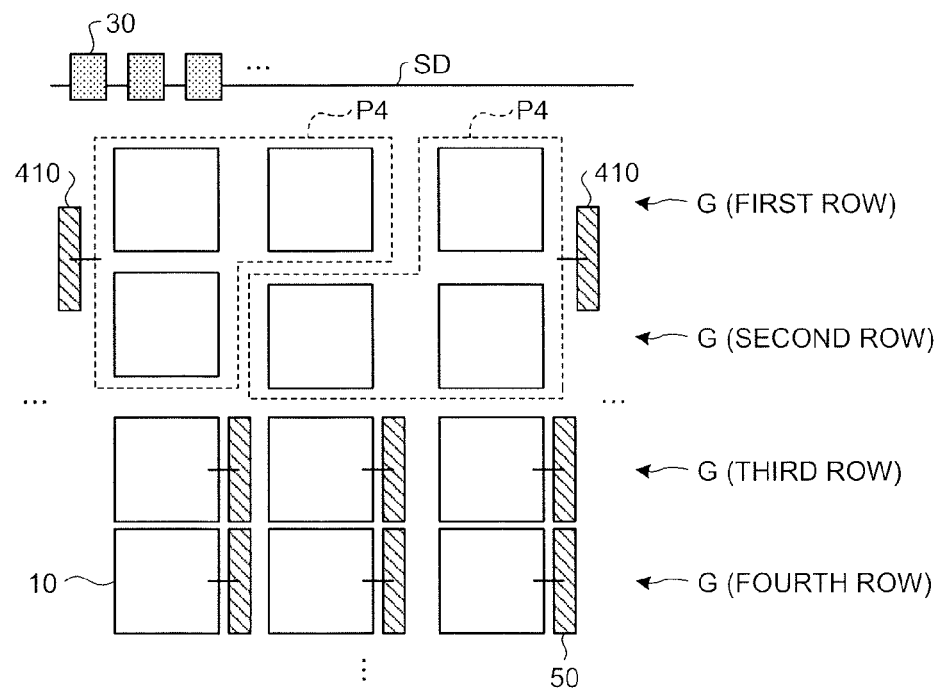
FIG. 8 is a diagram illustrating an example of the arrangement of a power control circuit according to a modified example of the second embodiment.

For example, as illustrated in FIG. 8, for a plurality of tiles 10 included in the respective sets G of the first row and the second row when counted from the side close to the side SD, one set P4 may be configured for each three tiles 10. In an example illustrated in FIG. 8, a common power control circuit 410 is disposed for each set P4. While the basic configuration of the power control circuit 410 is similar to that of the power control circuit 40 illustrated in FIG. 5, the power control circuit 410 controls the supply and the stop of the power source electric potential VD to each one of three tiles 10 included in the set P4. On the other hand, for tiles 10 other than the tiles 10 included in the sets P4, power control circuits 50 are individually disposed.

Third Embodiment

Next, a third embodiment will be described. In the third embodiment, the number of tiles 10 belonging to each set formed close to the used input-output unit 30 (side SD) is set to be changed for each set, which is different from each of the above-described embodiments. Hereinafter, the same reference numeral is assigned to each part that is common to each of the above-described embodiments, and the description thereof will not be repeated as is appropriate.

Figure 9:
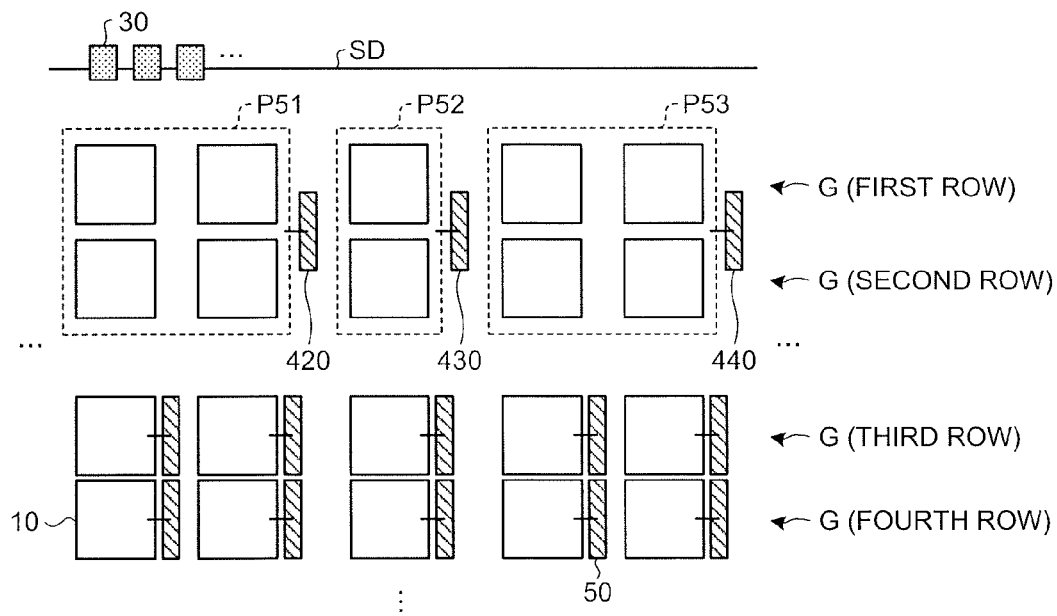
FIG. 9 is a diagram illustrating an example of the arrangement of a power control circuit according to a third embodiment.

In FIG. 9, three sets (P51, P52, and P53) formed near the side SD will be focused on. The number of tiles 10 included in each one of the three sets (P51, P52, and P53) illustrated in FIG. 9 are individually set. The set P51, similarly to that of the above-described second embodiment, is configured by four tiles 10 (four tiles 10 of 2 rows×2 columns) from among a plurality of tiles 10 included in respective sets G of the first row and the second row when counted from the side close to the side SD. The set P52 that is formed on the neighbor right-side thereof, similarly to that of the above-described first embodiment, is configured by first and second tiles 10 when counted from the side close to the side SD in a direction (column direction) perpendicular to the extending direction of the side SD. The set P53 that is formed on the neighbor right side thereof, similarly to that of the above-described modified example of the first embodiment, is configured by two tiles 10 out of a plurality of tiles 10 included in the set G of the first row when counted from the side closer to the side SD. In addition, for each one of the sets (P51, P52, and P53), a power control circuit that controls the supply and the stop of power to the tiles 10 included in the set is disposed. In this embodiment, the above-described three types of sets (P51, P52, and P53) are repeatedly formed near the side SD, and, for tiles 10 other than the tiles 10 included in any of the above-described three types of sets (P51, P52, and P53), power control circuits 50 are individually disposed.

In the example illustrated in FIG. 9, for the set P51, a power control circuit 420 that controls the supply and the stop of power to the four tiles 10 included in the set P51 is disposed. While the basic configuration of the power control circuit 420 is similar to that of the power control circuit 40 illustrated in FIG. 5, the power control circuit 420 controls the supply of power in common with the stop thereof with respect to each one of the four tiles 10 included in the set P51. In addition, for the set P52, a power control circuit 430 that controls the supply and the stop of power to two tiles 10 included in the set P52 is disposed. The basic configuration of the power control circuit 430 is similar to that of the power control circuit 40 illustrated in FIG. 5. Furthermore, for the set P53, a power control circuit 440 that controls the supply and the stop of power to two tiles 10 included in the set P53 is disposed. The basic configuration of the power control circuit 440 is similar to that of the power control circuit 40 illustrated in FIG. 5.

Modified Example of Third Embodiment

Figure 10:
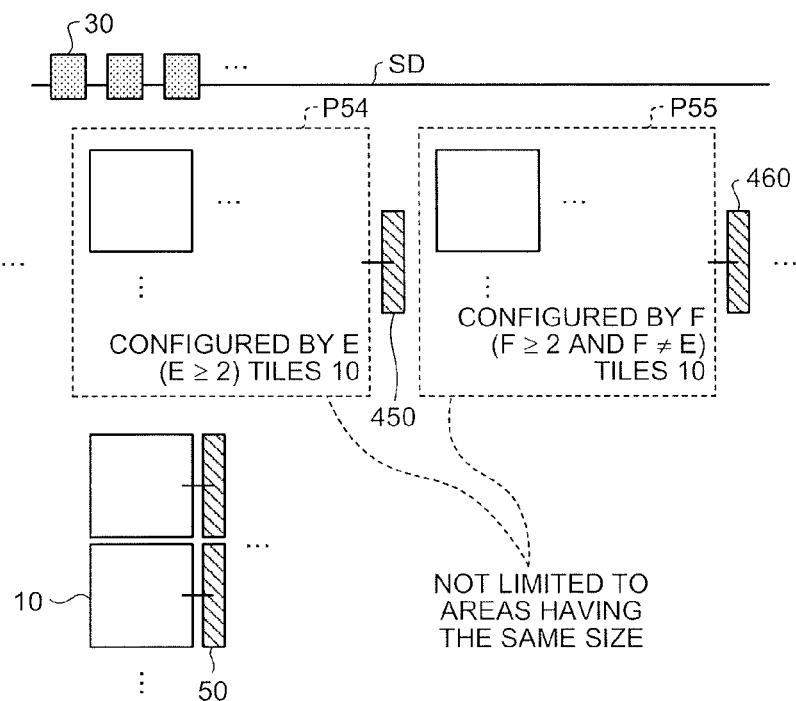
FIG. 10 is a diagram illustrating an example of the arrangement of a power control circuit according to a modified example of the third embodiment.

The number of tiles 10 included in the set formed near the side SD is not limited to the above-described content but may be arbitrarily set. For example, as illustrated in FIG. 10, it may be configured such that one set P54 is formed by E (E 2) tiles 10 out of tiles 10 (tiles 10 each having the operation probability that is a predetermined value or more) arranged near the side SD, and, on the right-side neighbor of the set P54, one set P55 is formed by F (an integer equal to or larger than two other than E) tiles 10. In addition, the tiles 10 included in the set P54 or the set P55 are not limited to the tiles 10 included in the set G of the first row and the set G of the second row respectively but may be tiles 10 included in a set G of the third row or a subsequent row.

Also in an example illustrated in FIG. 10, for each set (P54 or P55), a power control circuit that controls the supply and the stop of power to tiles 10 included in the set is disposed. In this embodiment, near the side SD, the above-described two types of sets (P54 and P55) are repeatedly formed, and, for tiles 10 other than the tiles 10 included in any one of the above-described two types of sets (P54 and P55), power control circuits 50 are individually disposed.

In the example illustrated in FIG. 10, for the set P54, a power control circuit 450 that controls the supply and the stop of power to E tiles 10 included in the set P54 is disposed. While the basic configuration of the power control circuit 450 is similar to that of the power control circuit 40 illustrated in FIG. 5, the power control circuit 450 controls the supply of the power source electric potential VD in common with and the stop thereof with respect to each one of the E tiles 10 included in the set P54. In addition, for the set P55, a power control circuit 460 that controls the supply and the stop of power to F tiles 10 included in the set P55 is disposed. While the basic configuration of the power control circuit 460 is similar to that of the power control circuit 40 illustrated in FIG. 5, the power control circuit 460 controls the supply of the power source electric potential VD in common with the stop thereof with respect to each one of the F tiles 10 included in the set P55.

For example, in a case where the logic that is implemented by the whole FPGA 100 is limited, an area (an area to which a tile 10 having a high operation probability belongs) having a high frequency of use is also limited; and accordingly, in the area having the high frequency of use, by forming a set having a large number of tiles and disposing a power control circuit corresponding to the set, the circuit scale can be further decreased. On the other hand, in an area having a low frequency of use, by forming a set having a small number of tiles (the set may have one tile) and disposing a power control circuit corresponding to the set, the power can be effectively decreased.

Fourth Embodiment

Next, a fourth embodiment will be described. In the fourth embodiment, grouping of tiles 10 to which the power control circuit is configured in common is performed in a stepped manner, and the grouping is performed such that, the closer to the used input-output unit 30 (the side SD) a tile 10 is located, the larger the number of tiles 10 included in the same set is, and, the farther from the used input-output unit 30 (the side SD) a tile 10 is located, the smaller the number of tiles 10 included in the same set is, which is different from the above-described embodiments. Hereinafter, the same reference numeral is assigned to each part that is common to each embodiment described above, and the description thereof will not be repeated as is appropriate.

Figure 11:
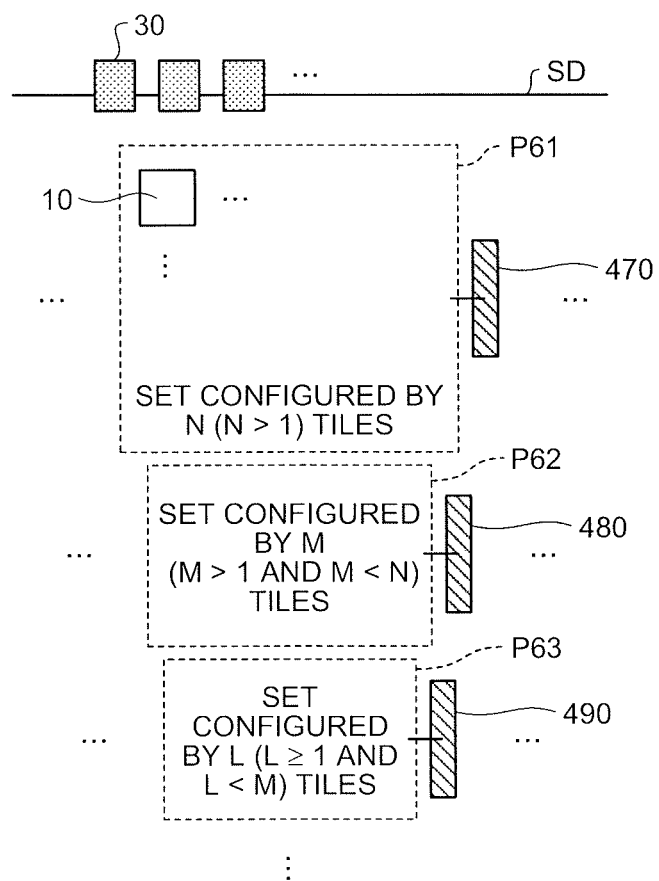
FIG. 11 is a diagram illustrating an example of the arrangement of a power control circuit according to a fourth embodiment.

In FIG. 11, three sets (P61, P62, and P63) will be focused on which are grouped such that, the closer to the side SD a tile 10 is located, the larger the number of tiles 10 included in the same set is; and, the farther from the side SD a tile 10 is located, the smaller the number of tiles 10 included in the same set is. The set P61 is configured by N (N>1) tiles 10 out of a plurality of tiles 10 each having the operation probability that is a first reference value or more. The set P62 is configured by M (M>1 and M<N) tiles 10 out of a plurality of tiles 10 each having the operation probability that is a second reference value or more and is less than the first reference value. The set P63 is configured by L (L≧1 and L<M) tiles 10 out of a plurality of tiles 10 each having the operation probability that is less than the second reference value.

In the example illustrated in FIG. 11, for the set P61, a power control circuit 470 that controls the supply and the stop of power to N tiles 10 included in the set P61 is disposed. While the basic configuration of the power control circuit 470 is similar to that of the power control circuit 40 illustrated in FIG. 5, the power control circuit 470 controls the supply of a power source electric potential VD in common with the stop thereof with respect to each one of the N tiles 10 included in the set P61. In addition, for the set P62, a power control circuit 480 that controls the supply and the stop of power to M tiles 10 included in the set P62 is disposed. While the basic configuration of the power control circuit 480 is similar to that of the power control circuit 40 illustrated in FIG. 5, the power control circuit 480 controls the supply of the power source electric potential VD in common with the stop thereof with respect to each one of the M tiles 10 included in the set P62. Furthermore, for the set P63, a power control circuit 490 that controls the supply and the stop of power to L tiles 10 included in the set P63 is disposed. While the basic configuration of the power control circuit 490 is similar to that of the power control circuit 40 illustrated in FIG. 5, the power control circuit 490 controls the supply of the power source electric potential VD in common with the stop thereof with respect to each one of the L tiles 10 included in the set P63.

In other words, it can be understood that the FPGA according to this embodiment includes: a first circuit group (for example, the set P63) that includes at least one logic block LB ("first logic block"); a second circuit group (for example, the set P61) that includes logic blocks LB ("second logic blocks") (the number of the second logic blocks>the number of the first logic blocks) and that is arranged at a position closer to the used input-output unit 30 than the first circuit group; and a third circuit group (for example, the set P62) that includes logic blocks LB ("third logic blocks") and that is arranged at a position located farther from the input-output unit 30 than the second circuit group, and is arranged at a position located closer to the input-output unit 30 than the first circuit group. The number of the third logic blocks is greater than the number of first logic blocks, the number of the third logic blocks is smaller than the number of the second logic blocks.

The first circuit group includes: a first switching block (in this example, the switching block SB that is included in each one of L tiles 10 included in the set P63) configured to include a switch (one or more switches) switching, in accordance with programmable control data, a connection of a wiring (one or more wirings) that is used for at least one of a connection of one of the first logic block, the second logic block, and a third logic block with the input-output unit 30, a connection between the first logic blocks, and a connection of the second logic block with the first logic block or a connection of the third logic block with the first logic block; and a first power control circuit (in this example, the power control circuit 490) configured to commonly control a start of power supply and a stop of the power supply with respect to the first logic block (in this example, the logic block LB included in each one of L tiles 10 included in the set P63) and the first switching block that are included in the first circuit group. In addition, the second circuit group includes: a second switching block (in this example, the switching block SB that is included in each one of N tiles 10 included in the set P61) configured to include a switch (one or more switches) switching, in accordance with programmable control data, a connection of a wiring (one or more wirings) that is used for at least one of a connection of one of the first logic block, the second logic block, and the third logic block with the input-output unit 30, a connection between the second logic blocks, and a connection of the first logic block with the second logic block or a connection of the third logic block with the second logic block; and a second power control circuit (in this example, the power control circuit 470) configured to commonly control a start of power supply and a stop of the power supply with respect to the second logic block (in this example, the logic block LB included in each one of N tiles 10 included in the set P61) and the second switching block that are included in the second circuit group. Furthermore, it can be understood that the third circuit group includes: a third switching block (in this example, the switching block SB that is included in each one of M tiles 10 included in the set P62) configured to include a switch (one or more switches) switching, in accordance with programmable control data, a connection of a wiring (one or more wirings) that is used for at least one of a connection of one of the first logic block, the second logic block, and the third logic block with the input-output unit 30, a connection between the third logic blocks, and a connection of the first logic block with the third logic block or a connection of the second logic block with the third logic block; and a third power control circuit (in this example, the power control circuit 480) configured to commonly control a start of power supply and a stop of the power supply with respect to the third logic block (in this example, the logic block LB included in each one of M tiles 10 included in the set P62) and the third switching block that are included in the third circuit group. According to the above-described configuration, compared to a configuration in which power control circuits 50 are individually disposed for all the tiles 10, the circuit scale can be decreased.

Modified Example 1 of Fourth Embodiment

Figure 12:
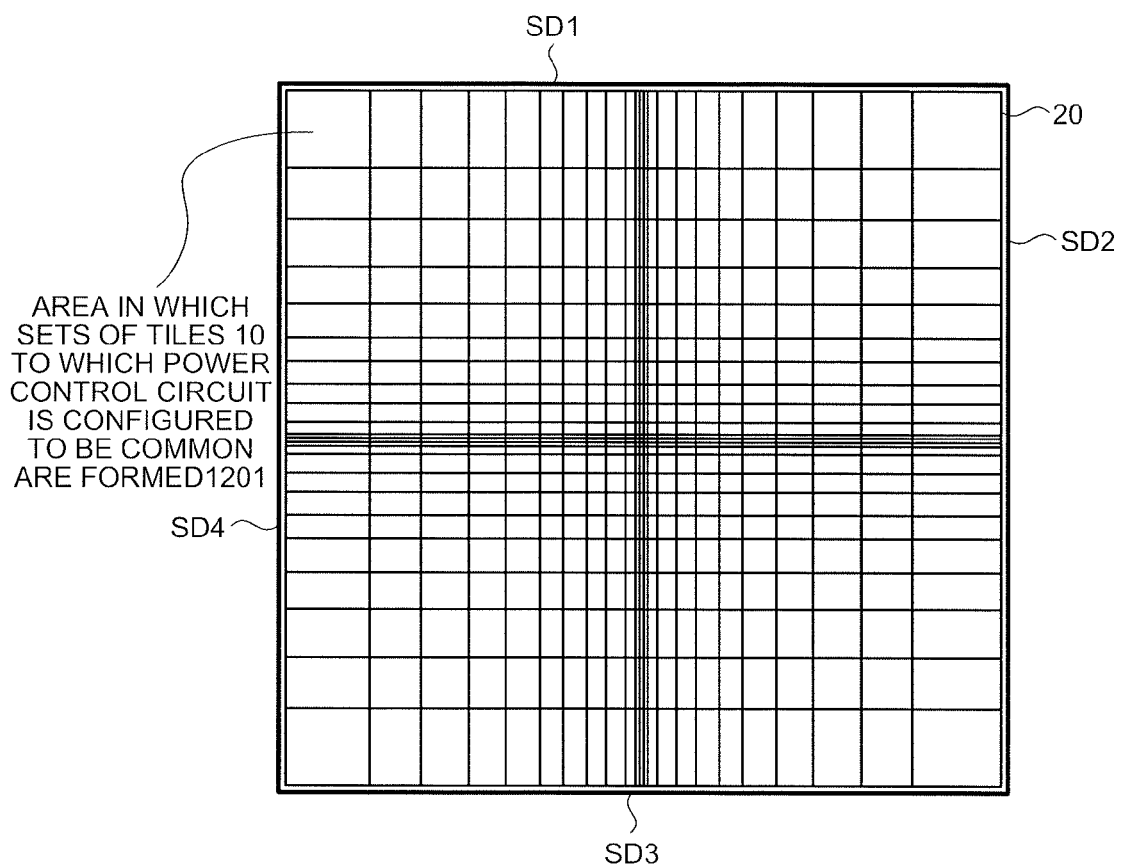
FIG. 12 is a diagram illustrating an example of grouping according to modified example 1 of the fourth embodiment.

For example, in a case where a user can freely designate a used input-output unit 30, as illustrated in FIG. 12, grouping may be performed such that, the closer to four sides (SD1 to SD4) configured by a plurality of input-output units 30 arranged so as to enclose the array unit 20 a tile 10 is located, the larger the number of tiles 10 (illustrated with numeral 1201) included in the same set is, and, the farther from the four sides SD a tile 10 is located, the smaller the number of tiles 10 included in the same set is. In other words, the sets may be formed such that the size of the area in which the sets are formed has point symmetry. The example illustrated in FIG. 12 is especially effective in a case where a logic function is implemented which is arranged and wired such that the input-output unit 30 arranged near the four corners of the array unit 20 having an approximate rectangle shape is used, and tile 10 located close to the input-output unit 30 is used, and the electric energy can be saved while the circuit scale is decreased in such a case.

Modified Example 2 of Fourth Embodiment

Figure 13:
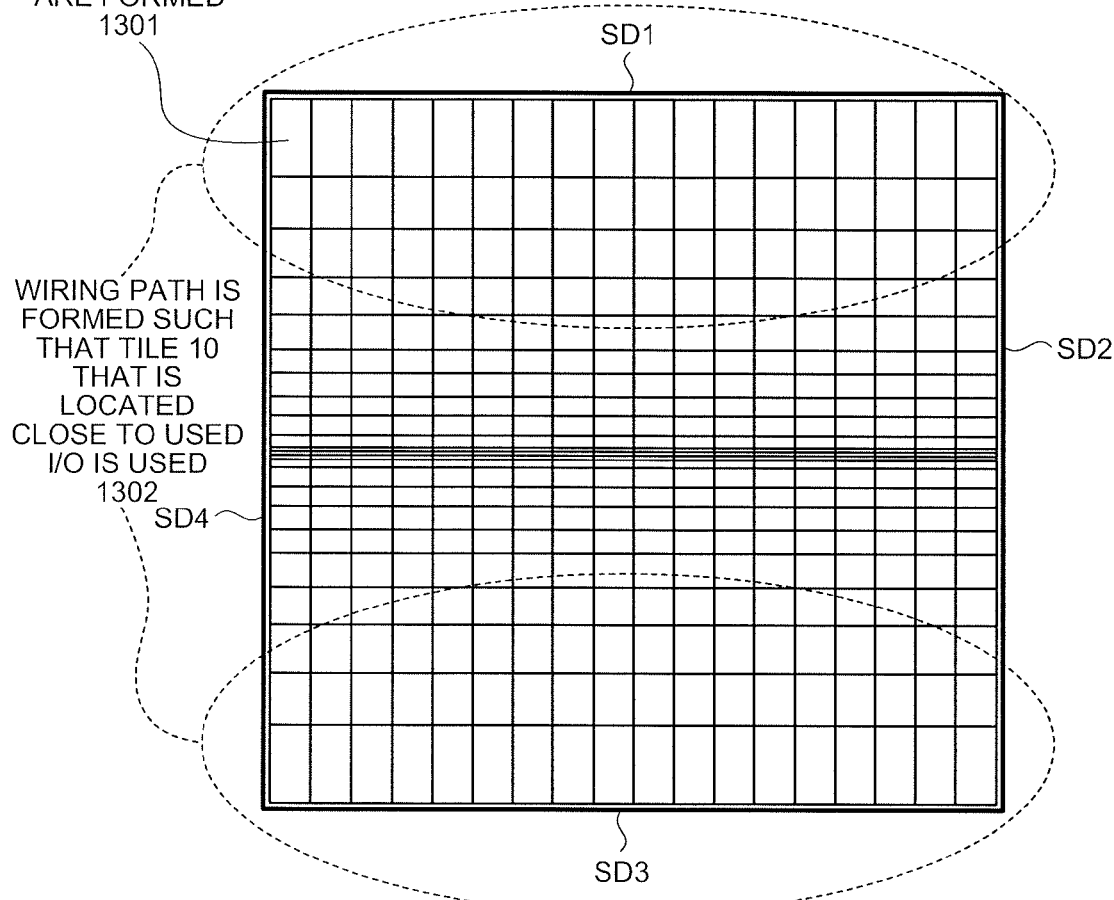
FIG. 13 is a diagram illustrating an example of grouping according to modified example 2 of the fourth embodiment.

For example, a case will be considered in which two sides SD1 and SD3 facing each other out of four sides (SD1 to SD4) that are configured by a plurality of input-output units 30 arranged so as to enclose an array unit 20 are used. In such a case, as illustrated in FIG. 13, since grouping is performed such that the closer to the two sides SD1 and SD3 a tile 10 is located, the larger the number of tiles 10 (as illustrated with numerals 1301 and 1302) included in the same set is, and the farther from the two sides SD1 and SD3 a tile 10 is located, the smaller the number of tiles 10 included in the same set is, the case is especially effective in a case where a logic function is implemented which is arranged and wired so as to use a tile 10 arranged near the sides SD1 and SD3, and the electric energy can be saved while the circuit scale is decreased.

Modified Example 3 of Fourth Embodiment

Figure 14:
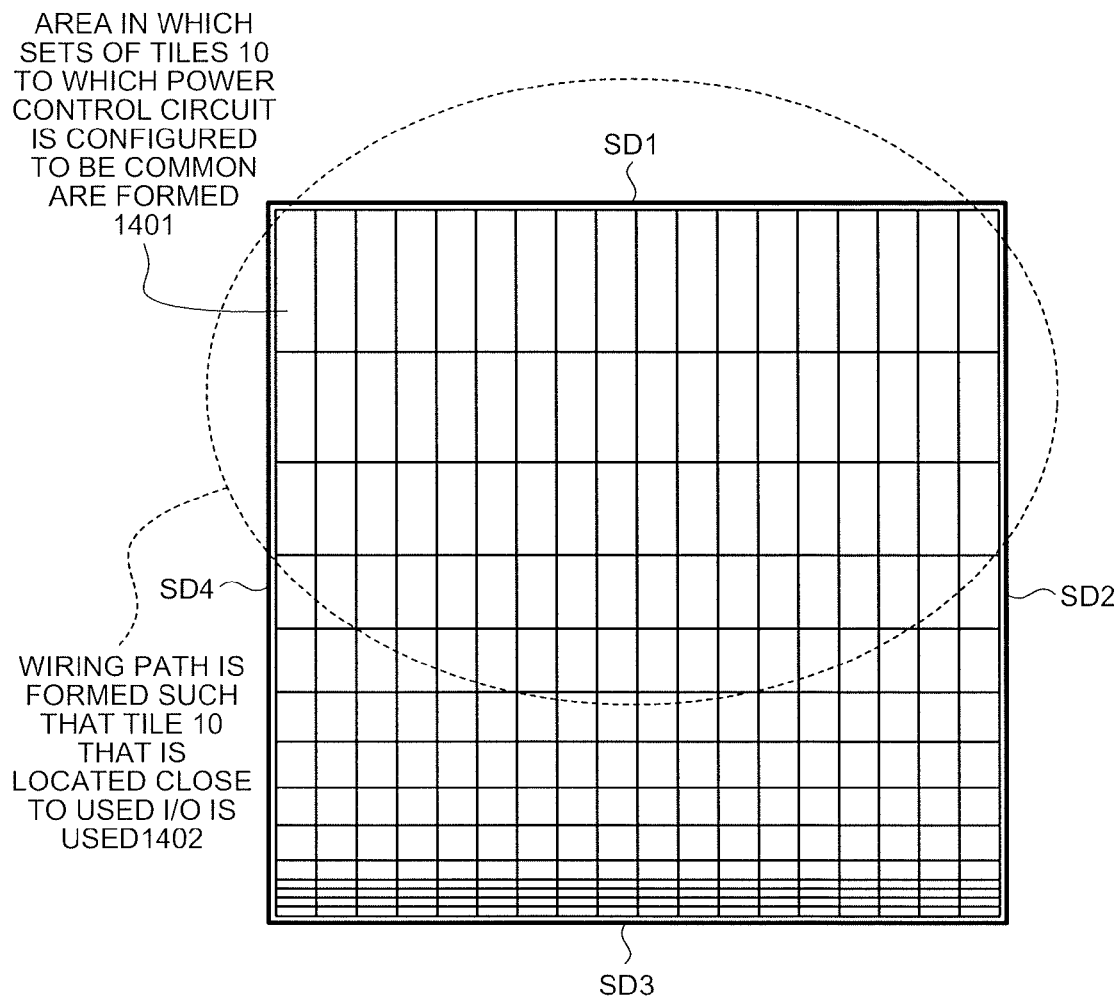
FIG. 14 is a diagram illustrating an example of grouping according to modified example 3 of the fourth embodiment.

For example, a case will be considered in which a side SD1 out of four sides (SD1 to SD4) that are configured by a plurality of input-output units 30 arranged so as to enclose an array unit 20 is used. In such a case, as illustrated in FIG. 14, since grouping is performed such that the closer to the side SD1 a tile 10 is located, the larger the number of tiles 10 included in the same set is (as illustrated with numerals 1401 and 1402), and the farther a tile 10 is located from the side SD1, the smaller the number of tiles 10 included in the same set is, the case is especially effective in a case where a logic function is implemented which is arranged and wired so as to use a tile 10 arranged near the side SD1, and the electric energy can be saved while the circuit scale is decreased.

Modified Example 4 of Fourth Embodiment

Figure 15:
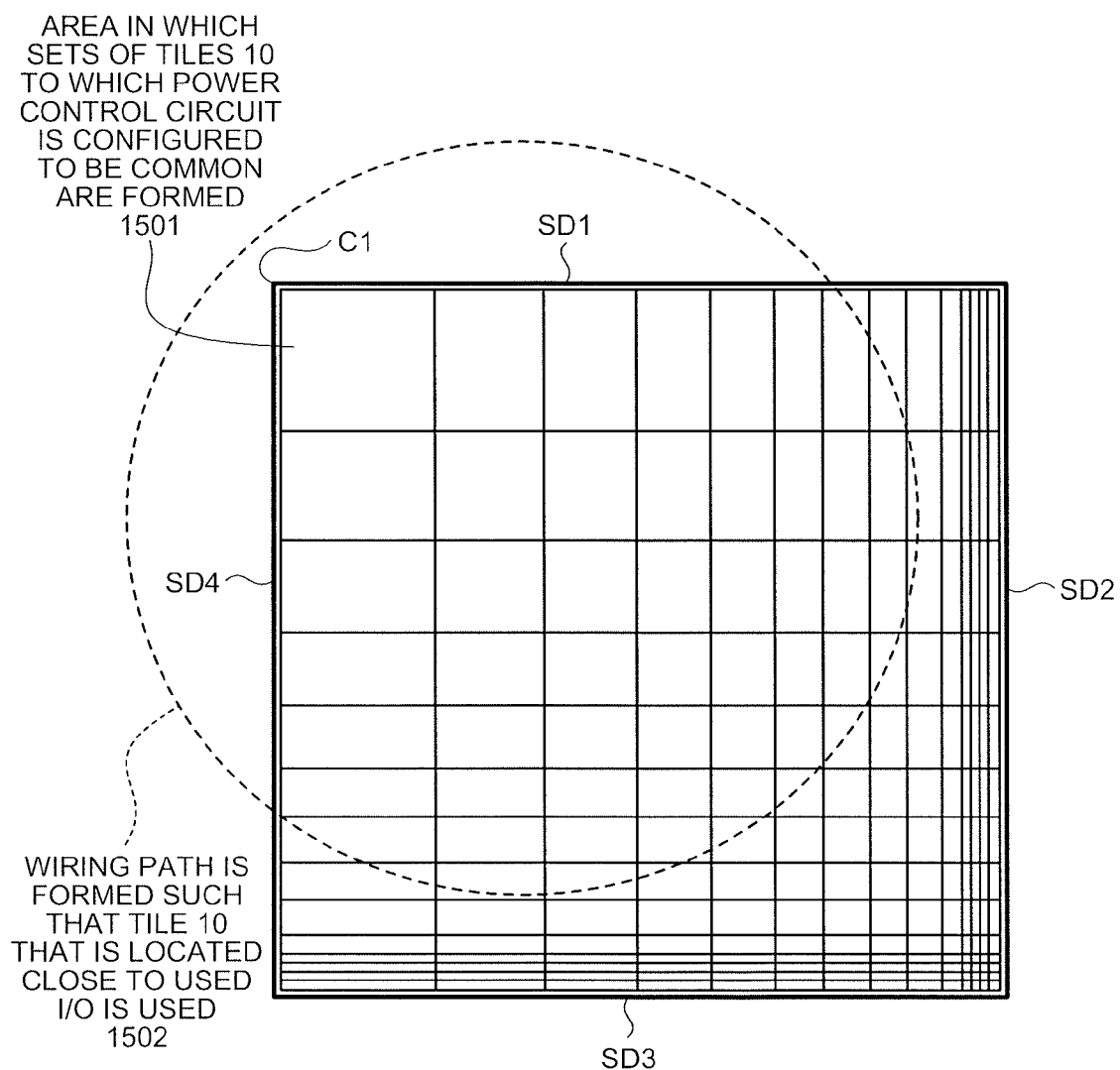
FIG. 15 is a diagram illustrating an example of grouping according to modified example 4 of the fourth embodiment.

For example, a case will be considered in which an input-output unit 30 located close to the corner C1 of a side SD1 and a side SD4 out of four sides (SD1 to SD4) that are configured by a plurality of input-output units 30 arranged so as to enclose an array unit 20 is used. In such a case, as illustrated in FIG. 15, since grouping is performed such that the closer to the corner C1 a tile 10 is located, the larger the number of tiles 10 included in the same set is (as illustrated with numerals 1501 and 1502), and the farther a tile 10 is located from the corner C1, the smaller the number of tiles 10 included in the same set is, the case is especially effective in a case where a logic function is implemented which is arranged and wired so as to use a tile 10 arranged near the corner C1, and the electric energy can be saved while the circuit scale is decreased.

Fifth Embodiment

Next, a fifth embodiment will be described. According to the fifth embodiment, the number of tiles included in a set that is formed at a position close to a used input-output unit 30 is smaller than the number of tiles included in a set that is formed at a position located farther from the used input-output unit 30 from the set, which is different from each embodiment described above. Hereinafter, the same reference numeral is assigned to each part that is common to each embodiment described above, and the description thereof will not be repeated as is appropriate.

Figure 16:
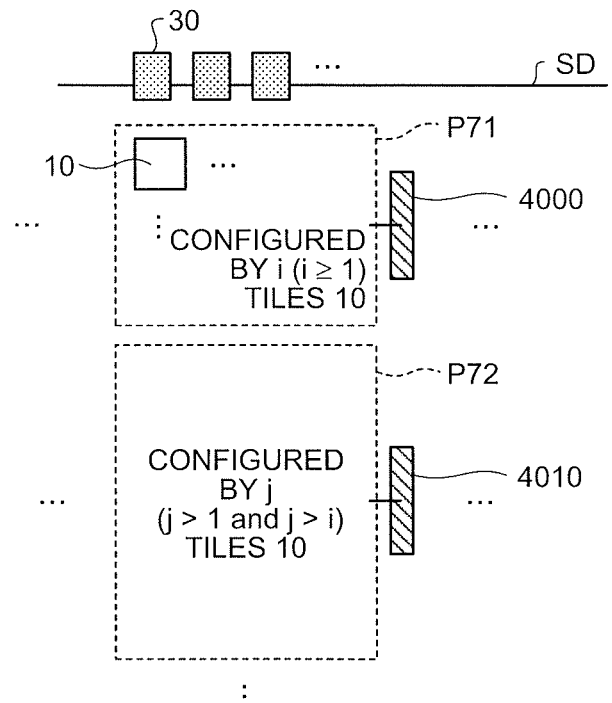
FIG. 16 is a diagram illustrating an example of the arrangement of a power control circuit according to a fifth embodiment.

In FIG. 16, two sets (P71 and P72) will be focused on which are grouped such that, the closer to the side SD that is configured by a plurality of used input-output units 30 a tile 10 is located, the smaller the number of tiles 10 included in the same set is, and, the farther a tile 10 is located from the side SD, the larger the number of tiles included in the same set is. The set P71 is configured by ($i \geq 1$) tiles 10 out of a plurality of tiles each having the operation probability that is a first reference value or more. The set P72 is configured by j (j>1 and j>i) tiles 10 out of a plurality of tiles each having the operation probability that is less than the first reference value.

In the example illustrated in FIG. 16, for the set P71, disposed is a power control circuit 4000 that controls the supply and the stop of power to i tiles 10 included in the set P71. While the basic configuration of the power control circuit 4000 is similar to that of the power control circuit 40 illustrated in FIG. 5, the power control circuit 4000 controls the supply of a power source electric potential VD in common with the stop thereof with respect to the i tiles included in the set P71. In addition, for the set P72, disposed is a power control circuit 4010 that controls the supply and the stop of power to j tiles 10 included in the set P72. While the basic configuration of the power control circuit 4010 is similar to that of the power control circuit 40 illustrated in FIG. 5, the power control circuit 4010 controls the supply of the power source electric potential VD in common with the stop thereof with respect to the j tiles 10 included in the set P72.

In other words, it can be understood that the FPGA according to this embodiment includes a first circuit group (for example, the set P71) that includes at least one logic block LB and a second circuit group (for example, the set P72) that includes logic blocks LB more than the first circuit group and is arranged at a position farther from the used input-output unit 30 than the first circuit group. In addition, the first circuit group includes a first switching block (in this example, the switching block SB that is included in each one of the i tiles 10 included in the set P71) and a first power control circuit (in this example, the power control circuit 4000) that controls the supply of power in common with the stop thereof with respect to the logic blocks LB and the first switching blocks that are included in the first circuit group. Furthermore, it is understood that the second circuit group includes second switching blocks (in this example, the switching block SB that is included in each one of j tiles 10 included in the set P72) and a second power control circuit (in this example, the power control circuit 4010) that controls the supply of power in common with the stop thereof with respect to the logic blocks LB and the second switching blocks that are included in the second circuit group.

Modified Example of Fifth Embodiment

For example, grouping may be performed such that the number of tiles 10 included in a first set (it can be assumed that another set (circuit group) is not present between the input-output unit 30 and the first set) that is formed at a position closest to the used input-output unit 30 is smaller than the number of tiles 10 included in a second set that is formed at a position farther from the input-output unit 30 than the first set, and the number of tiles 10 included in a third set that is formed at a position located farther from the input-output unit 30 than the second set is smaller than the number of tiles 10 included in the second set. In other words, the grouping may be formed such that, for tiles 10 other than the tiles 10 included in the above-described first set, the closer to the side SD a tile 10 is located, the larger the number of tiles 10 included in the same set is, and, the farther from the side SD a tile 10 is located, the smaller the number of tiles 10 included in the same set.

Figure 17:
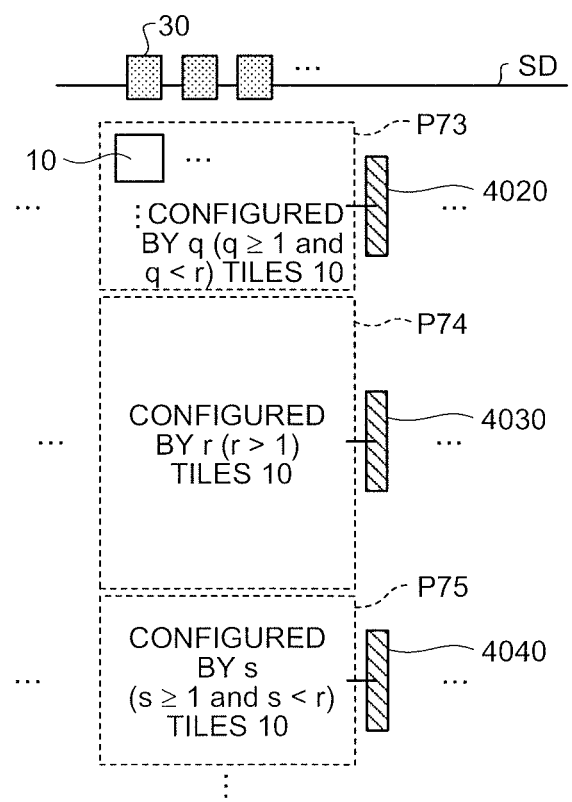
FIG. 17 is a diagram illustrating an example of the arrangement of a power control circuit according to a modified example of the fifth embodiment.

In FIG. 17, a set P73 that is formed at a position closet to the side SD configured by a plurality of used input-output units 30, a set P74 that is adjacent to the set P73 in a direction perpendicular to the side SD and is formed at a position farther from the side SD than the set P73, and a set P75 that is adjacent to the set P74 in the direction perpendicular to the side SD and is formed at a position farther from the side SD than the set P74 will be focused on in the description. The set P73 is configured by q tiles 10 out of a plurality of tiles 10 each having the operation probability that is a first reference value or more. The set P74 is configured by r tiles 10 out of a plurality of tiles 10 each having the operation probability that is a second reference value or more and is less than the first reference value. The set P75 is configured by s tiles 10 out of a plurality of tiles 10 each having the operation probability that is less than the second reference value. The number q of tiles 10 included in the set P73 is one or more and is smaller than the number r of tiles 10 included in the set P74. In addition, the number r of tiles 10 included in the set P74 is larger than one. The number s of tiles 10 included in the set P75 is one or more and is smaller than the number r of tiles 10 included in the set P74.

In the example illustrated in FIG. 17, for the set P73, a power control circuit 4020 that controls the supply and the stop of power to q tiles 10 included in the set P73 is disposed. While the basic configuration of the power control circuit 4020 is similar to that of the power control circuit 40 illustrated in FIG. 5, the power control circuit 4020 controls the supply of a power source electric potential VD in common with the stop thereof with respect to the q tiles included in the set P73. In addition, for the set P74, a power control circuit 4030 that controls the supply and the stop of power to r tiles 10 included in the set P74 is disposed. While the basic configuration of the power control circuit 4030 is similar to that of the power control circuit 40 illustrated in FIG. 5, the power control circuit 4030 controls the supply of the power source electric potential VD in common with the stop thereof with respect to the r tiles 10 included in the set P74. Furthermore, for the set P75, a power control circuit 4040 that controls the supply of power to s tiles 10 included in the set P75 is disposed. While the basic configuration of the power control circuit 4040 is similar to that of the power control circuit 40 illustrated in FIG. 5, the power control circuit 4040 controls the supply of the power source electric potential VD in common with the stop thereof with respect to the s tiles 10 included in the set P75.

In other words, it can be understood that the FPGA according to this embodiment includes: a first circuit group (for example, the set P73) that includes at least one logic block LB ("first logic block"); a second circuit group (for example, the set P74) that includes logic blocks LB ("second logic blocks") (the number of the second logic blocks>the number of the first logic blocks) and that is arranged at a position farther from the used input-output unit 30 than the first circuit group; and a fourth circuit group (for example, the set P75) that includes logic blocks LB ("fourth logic blocks") and that is arranged at a position located farther from the used input-output unit 30 than the second circuit group. The number of the fourth logic blocks is smaller than the number of the second logic blocks.

The first circuit group includes: a first switching block (in this example, the switching block SB that is included in each one of q tiles 10 included in the set P73) configured to include a switch (one or more switches) switching, in accordance with programmable control data, a connection of a wiring (one or more wirings) that is used for at least one of a connection of one of the first logic block, the second logic block, and a fourth logic block with the input-output unit 30, a connection between the first logic blocks, and a connection of the second logic block with the fourth logic block or a connection of the first logic block with the fourth logic block; and a first power control circuit (in this example, the power control circuit 4020) configured to commonly control a start of power supply and a stop of the power supply with respect to the first logic block (in this example, the logic block LB included in each one of q tiles 10 included in the set P73) and the first switching block that are included in the first circuit group. In addition, the second circuit group includes a second switching block (in this example, the switching block SB that is included in each one of r tiles 10 included in the set P74) configured to include a switch (one or more switches) switching, in accordance with programmable control data, a connection of a wiring (one or more wirings) that is used for at least one of a connection of one of the first logic block, the second logic block, and the fourth logic block with the input-output unit 30, a connection between the second logic blocks, and a connection of the first logic block with the second logic block or a connection of the fourth logic block with the second logic block; and a second power control circuit (in this example, the power control circuit 4030) configured to commonly control a start of power supply and a stop of the power supply with respect to the second logic block (in this example, the logic block LB included in each one of r tiles 10 included in the set P74) and the second switching block that are included in the second circuit group. Furthermore, it can be understood that the fourth circuit group includes: a fourth switching block (in this example, the switching block SB that is included in each one of s tiles 10 included in the set P75) configured to include a switch (one or more switches) switching, in accordance with programmable control data, a connection of a wiring (one or more wirings) that is used for at least one of a connection of one of the first logic block, the second logic block, and the fourth logic block with the input-output unit 30, a connection between the fourth logic blocks, and a connection of the first logic block with the fourth logic block or a connection of the second logic block with the fourth logic block; and a fourth power control circuit (in this example, the power control circuit 4040) configured to commonly control a start of power supply and a stop of the power supply with respect to the fourth logic block (in this example, the logic block LB included in each one of s tiles 10 included in the set P75) and the fourth switching block that are included in the fourth circuit group.

In addition, it can be understood that the FPGA 100 according to this embodiment includes: a first circuit group (for example, the set P75) that includes at least one logic block LB ("first logic block"); a second circuit group (for example, the set P74) that includes logic blocks LBs ("second logic block-")(the number of the second logic blocks>the number of the first logic blocks) and that is arranged at positions closer to the used input-output unit 30 than the first circuit group; and a fifth circuit group (for example, the set P73) that includes logic blocks LBs ("fifth logic blocks") and that is arranged at positions closer to the used input-output unit 30 than the second circuit group. The number of the fifth blocks is smaller than the number of the second logic blocks.

The first circuit group includes: a first switching block (in this example, the switching block SB that is included in each one of s tiles 10 included in the set P75) configured to include a switch (one or more switches) switching, in accordance with programmable control data, a connection of a wiring (one or more wirings) that is used for at least one of a connection of one of the first logic block, the second logic block, and a fifth logic block with the input-output unit 30, a connection between the first logic blocks, and a connection of the second logic block with the first logic block or a connection of the fifth logic block with the first logic block; and a first power control circuit (in this example, the power control circuit 4040) configured to commonly control a start of power supply and a stop of the power supply with respect to the first logic block (in this example, the logic block LB included in each one of s tiles 10 included in the set P75) and the first switching block that are included in the first circuit group. In addition, the second circuit group includes: a second switching block (in this example, the switching block SB that is included in each one of r tiles 10 included in the set P74) configured to include a switch (one or more switches) switching, in accordance with programmable control data, a connection of a wiring (one or more wirings) that is used for at least one of a connection of one of the first logic block, the second logic block, and the fifth logic block with the input-output unit 30, a connection between the second logic blocks, and a connection of the first logic block with the second logic block or a connection of the fifth logic block with the second logic block; and a second power control circuit (in this example, the power control circuit 4030) configured to commonly control a start of power supply and a stop of the power supply with respect to the second logic block (in this example, the logic block LB included in each one of r tiles 10 included in the set P74) and the second switching block that are included in the second circuit group. Furthermore, it can be understood that the fifth circuit group includes: a fifth switching block (in this example, the switching block SB that is included in each one of q tiles 10 included in the set P73) configured to include a switch (one or more switches) switching, in accordance with programmable control data, a connection of a wiring (one or more wirings) that is used for at least one of a connection of one of the first logic block, the second logic block, and the fifth logic block with the input-output unit 30, a connection between the fifth logic blocks, and a connection of the first logic block with the fifth logic block or a connection of the second logic block with the fifth logic block; and a fifth power control circuit (in this example, the power control circuit 4020) configured to commonly control a start of power supply and a stop of the power supply with respect to the fifth logic block (in this example, the logic block LB included in each one of q tiles 10 included in the set P73) and the fifth switching block that are included in the fifth circuit group.

Figure 18:
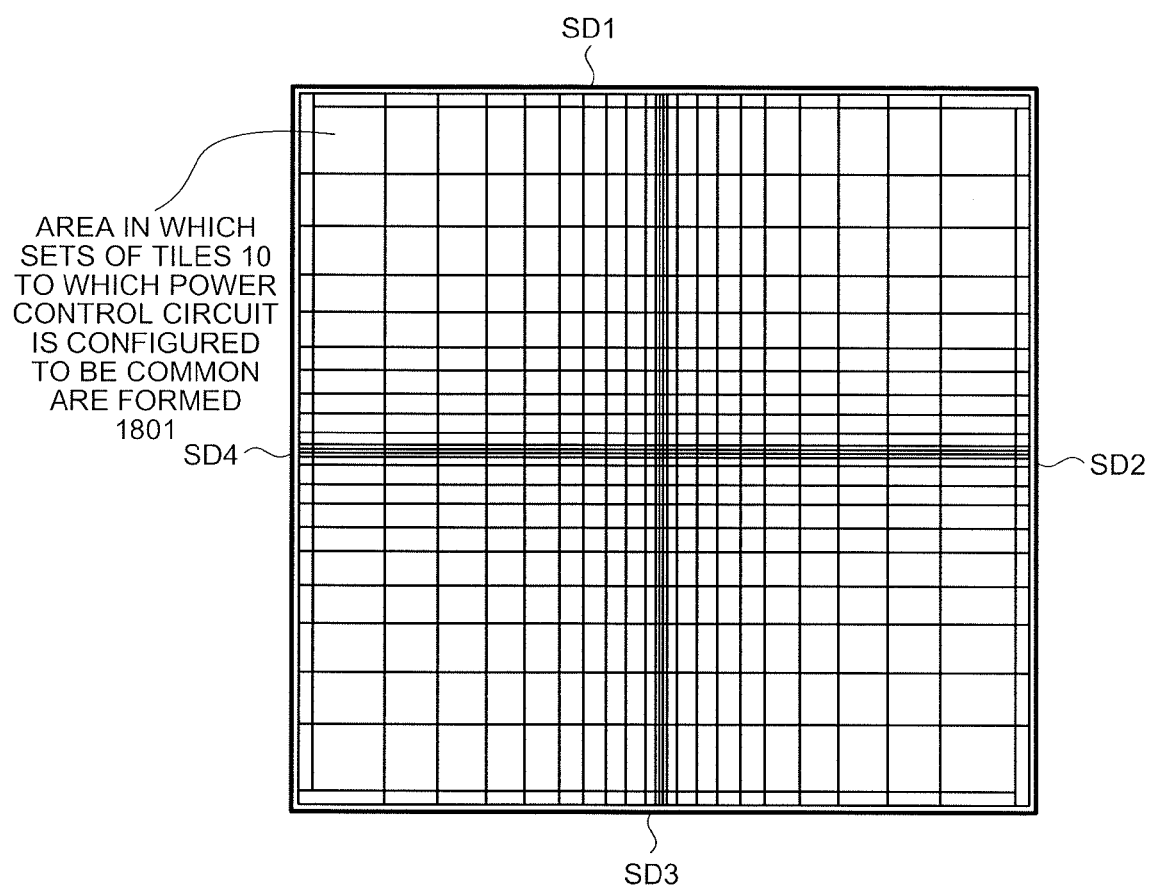
FIG. 18 is a diagram illustrating an example of grouping according to a modified example of the fifth embodiment.

For example, in a case where four sides (SD1 to SD4) that are configured by a plurality of input-output units 30 arranged so as to enclose the array unit 20 are used, sets may be formed (grouping may be performed) as illustrated in FIG. 18 with numerals 1801.

Figure 19:
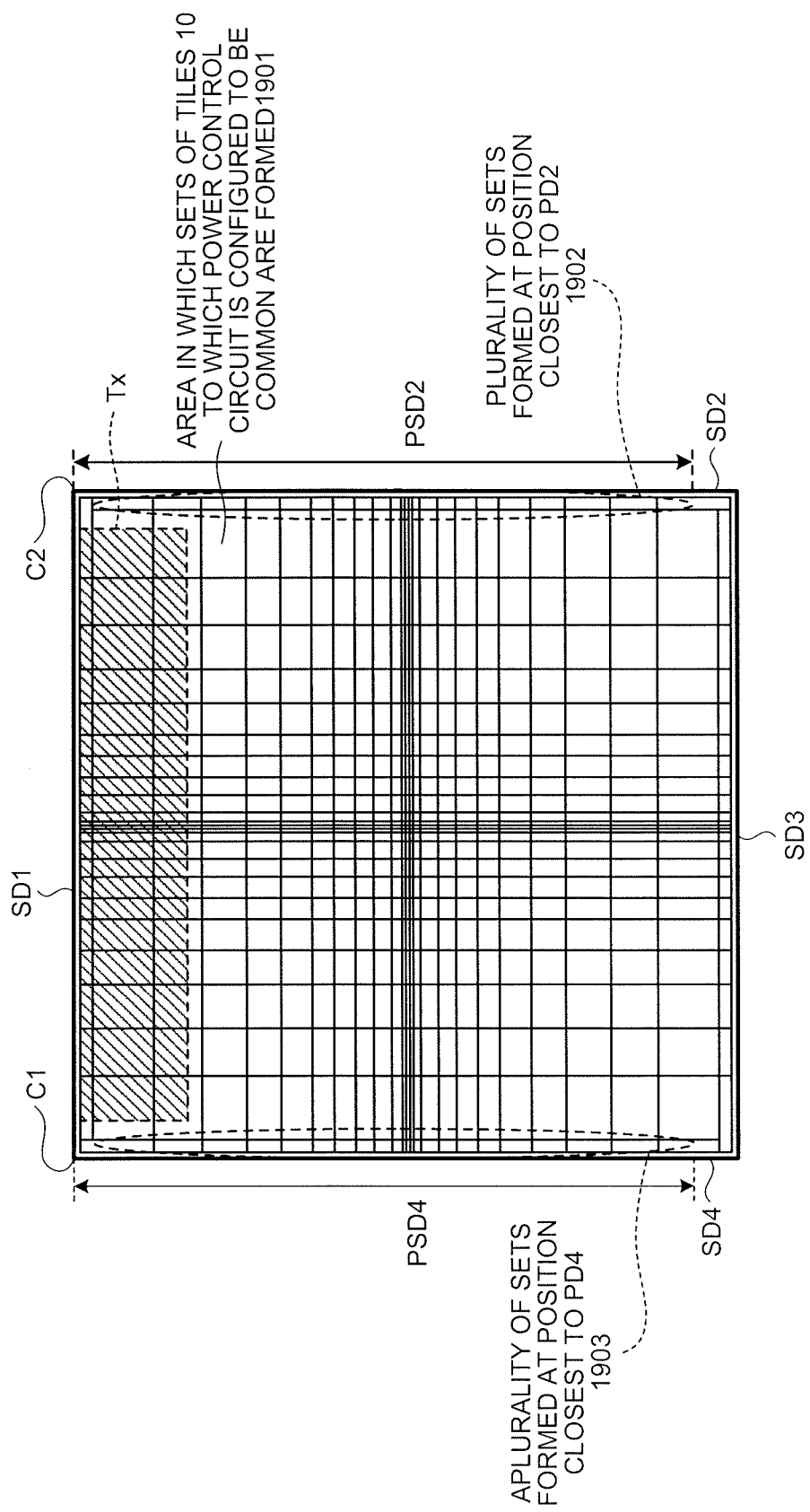
FIG. 19 is a diagram illustrating an example of grouping according to a modified example of the fifth embodiment.

In addition, for example, in a case where the sides SD1, SD2, and SD4 are used, sets may be formed as illustrated in FIG. 19 with numerals 1901, 1902, and 1903. In the example illustrated in FIG. 19, a case will be considered in which a logic block LB included inside a rectangular area Tx near the side SD1 is used, a portion PSD2 that extends within the side SD2 from the corner C2 of the sides SD1 and SD2 along the side SD2 by a predetermined distance is used, and a portion PSD4 that extends within the side SD4 from the corner C1 of the sides SD1 and SD4 along the side SD4 by a predetermined distance is used. More specifically, a case will be described in which, in addition to the side SD1, the input-output unit 30 configuring the portions PSD2 and PSD4 is used, and the logic block LB inside the area Tx is the only logic block LB to be used. In other words, in this example, the portions PSD2 and PSD4 are used as wirings, and a tile 10 (the switching block SB) included in each of a plurality of sets formed at a position closest to the portion PSD2 is operated such that a wiring path from the logic block LB inside the area Tx to the portion PSD2 is formed. Similarly, a tile 10 included in each of a plurality of sets formed at a position closest to the portion PSD4 is operated such that a wiring path from the logic block LB inside the area Tx to the portion PSD4 is formed.

In the example illustrated in FIG. 19, since the number of tiles 10 included in the set (referred to as a "first set") formed at the position closest to the used input-output unit 30 is smaller than the number of tiles 10 included in the second set that is adjacent to the first set and is formed at a position located farther from the input-output unit 30 than the first set, compared to a case where grouping is performed such that the number of tiles 10 included in the first set is larger than the number of tiles 10 included in another set (in a case where grouping is performed such that the number of tiles 10 included in the first set is the largest), the power consumption can be decreased. In other words, in the example illustrated in FIG. 19, by decreasing the number of tiles 10 included in the first set that is formed at the position closest to the portion PSD2 (PSD4) used as a wiring, the number of tiles 10 used as wirings is decreased. Accordingly, the power consumption can be decreased.

As above, while each embodiment has been described, such embodiments are mere examples and are not for the purpose of limiting the scope of the invention. These novel embodiments can be performed in other various forms, and omission, substitutions, and changes in various forms can be made within the range not departing from the concept of the invention. These embodiments and the modifications thereof are included in the scope and the concept of the invention, and are included in the scope of the invention described in the claims and the scope of equivalents thereof.

In conclusion, the FPGA to which the embodiment is applied may include at least two sets (the first circuit group and the second circuit group) that have different number of tiles 10 (the number of logic blocks LB that can implement a specific logic function) to which the power control circuit is used to be common. In such a case, compared to a case where a power control circuit is individually disposed for each unit that can implement a specific logic function, the circuit scale can be decreased.

Figure 20:
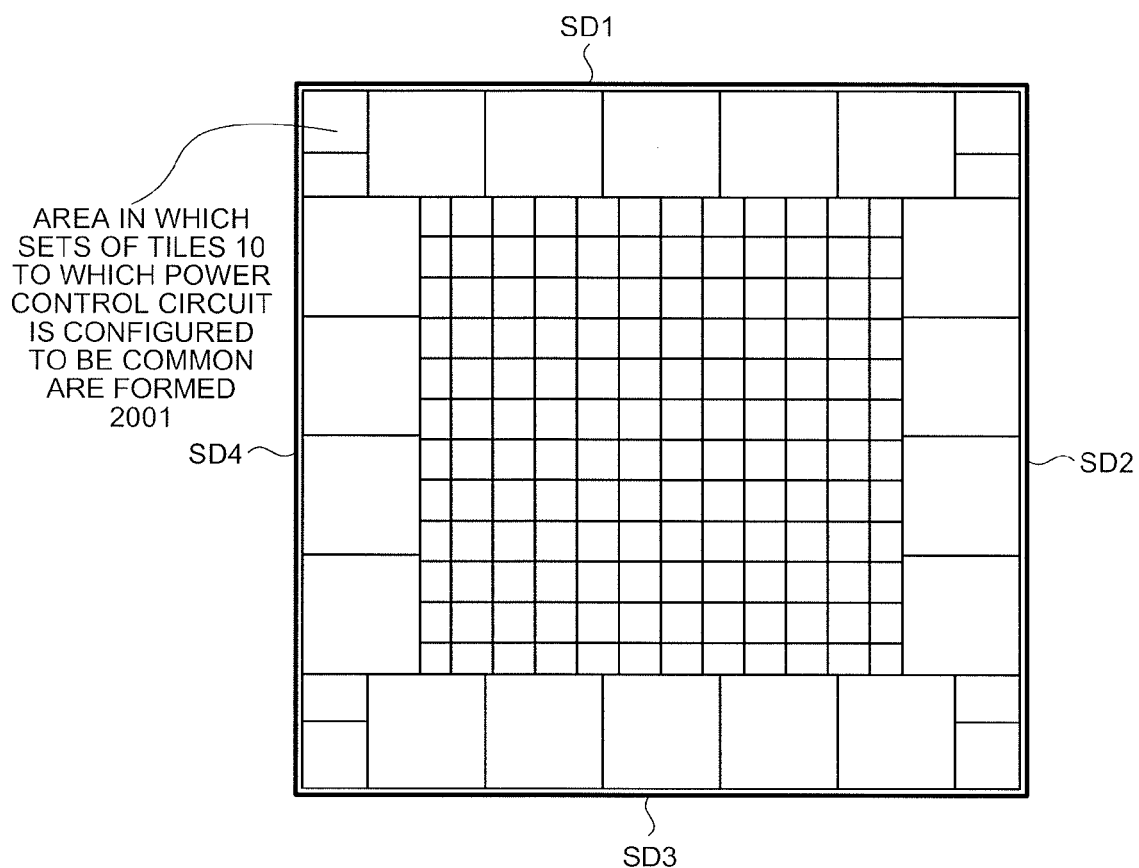
FIG. 20 is a diagram illustrating an example of grouping according to a modified example.

In addition, in each embodiment and modified example described above, although the sets formed inside the FPGA are delimited by a plurality of straight lines extending in the row direction and a plurality of straight lines extending in the column direction, an embodiment is not limited thereto, and, for example, as illustrated in FIG. 20 with numerals 2001, grouping may be performed such that boundary lines of adjacent sets do not coincide with each other.

Furthermore, in the above-described example illustrated in FIG. 5, although the switching element 41 is configured by the P-type MOSFET, an embodiment is not limited thereto, and the configuration of the switching element 41 is arbitrary. In conclusion, the power control circuit 40 may have a configuration in which the supply and the stop of power to the corresponding set P1 can be controlled, and the configuration is not limited to that illustrated in FIG. 5. In modified examples presented below, a case will be described as an example in which the number of tiles 10 included in the set P1 corresponding to the switching element 41 is three.

Figure 21:
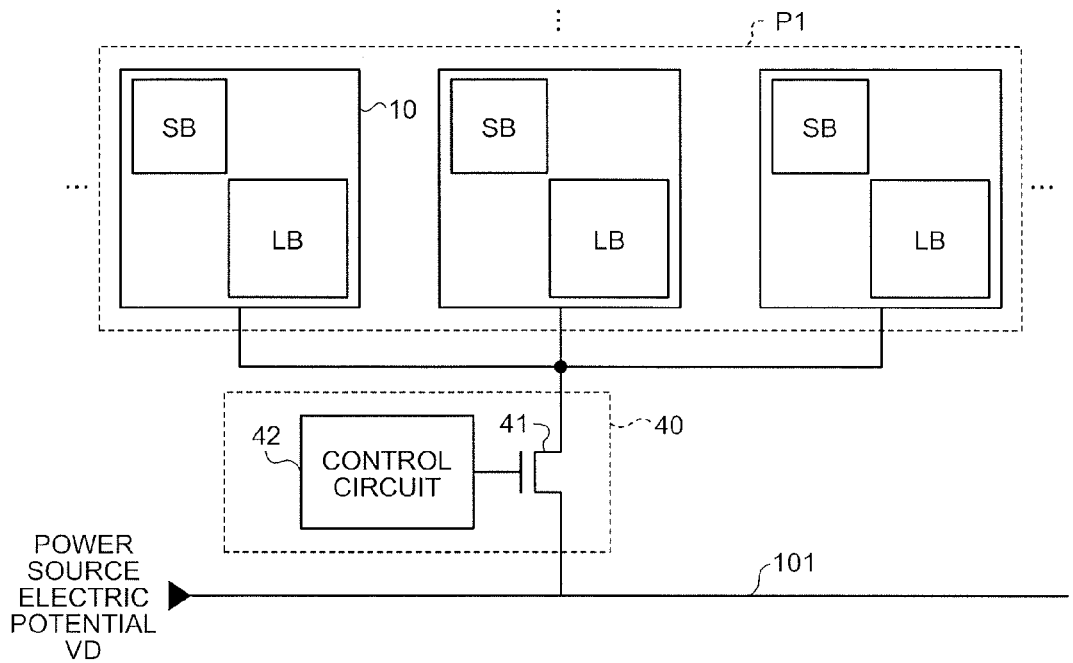
FIG. 21 is a diagram illustrating an example of the configuration of a power control circuit according to a modified example.
Figure 22:
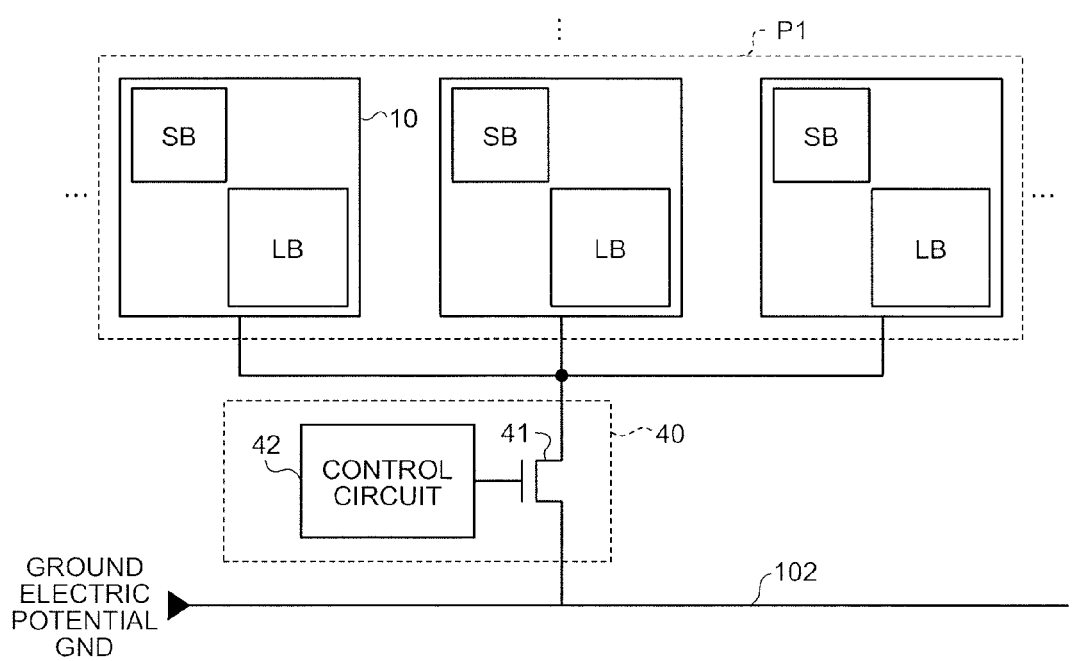
FIG. 22 is a diagram illustrating an example of the configuration of a power control circuit according to a modified example.

For example, as illustrated in FIG. 21, the switching element 41 may be configured by an N-type MOSFET. In addition, in a case where the switching element 41 is configured by the N-type MOSFET, for example, as illustrated in FIG.

22, a configuration may be employed in which the set P1 is arranged between a power supply line (not illustrated in the drawing) through which the power source electric potential VD is supplied and a ground line 102 to which the ground electric potential GND (for example, 0 V) is supplied, and the power control circuit 40 is arranged between the set P1 and the ground line 102.

Figure 23:
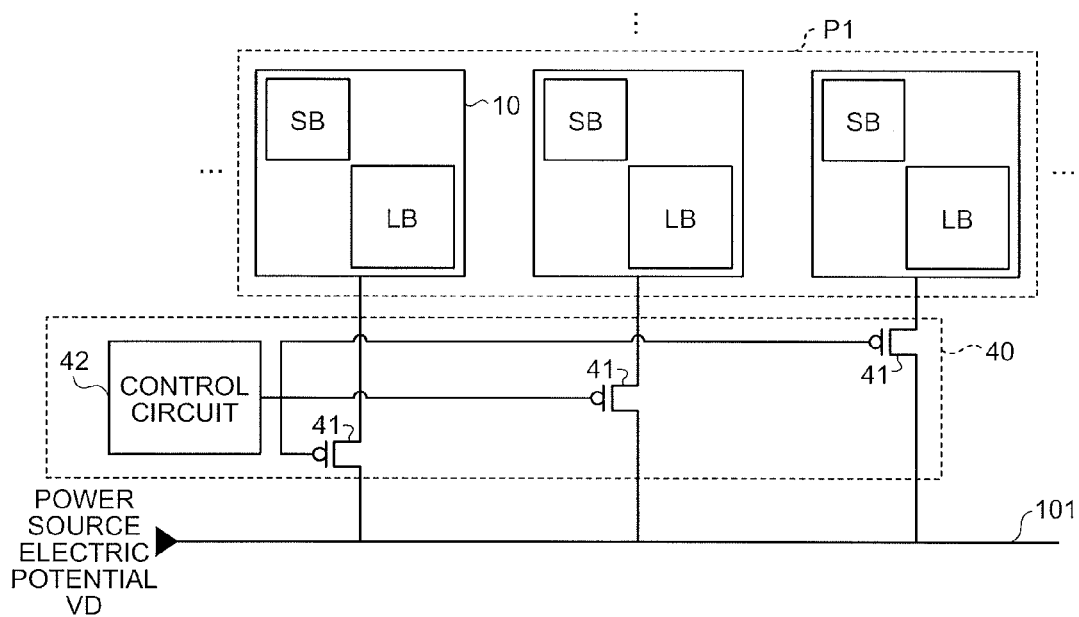
FIG. 23 is a diagram illustrating an example of the configuration of a power control circuit according to a modified example.
Figure 24:
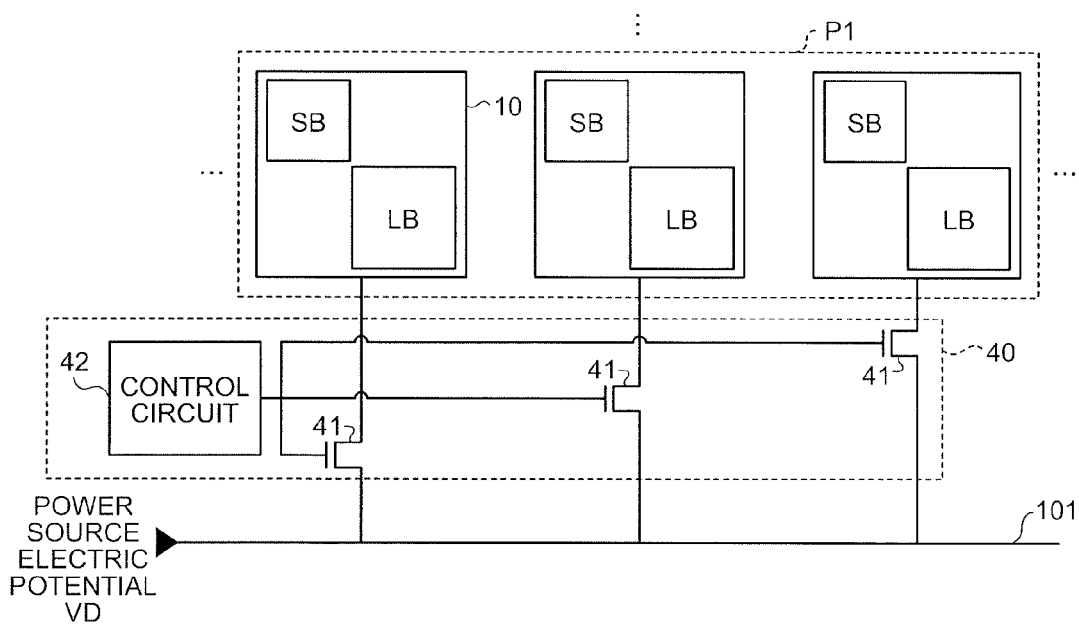
FIG. 24 is a diagram illustrating an example of the configuration of a power control circuit according to a modified example.

In addition, for example, as illustrated in FIGS. 23 and 24, a configuration may be employed in which the switching element 41 configured by the P-type MOSFETs or the N-type MOSFETs are individually disposed between three tiles 10 included in the set P1 and the power supply line 101. In such a configuration, the gates of the three switching elements 41 are connected to the control circuit 42 so as to be common, and the On/Off of the three switching elements 41 are controlled together in accordance with a switching control signal transmitted from the control circuit 42. Even in such a configuration, the number of the control circuit 42 disposed in correspondence with the set P1 is one, and, compared to a case where the control circuits 42 are individually disposed for each tile 10, the circuit scale can be decreased. By using the switching element 41 that is switched between the supply and the stop of power to the three tiles 10 included in the set P1 so as to be common, as in each embodiment and modified example described above, the circuit scale can be further decreased.

Figure 25:
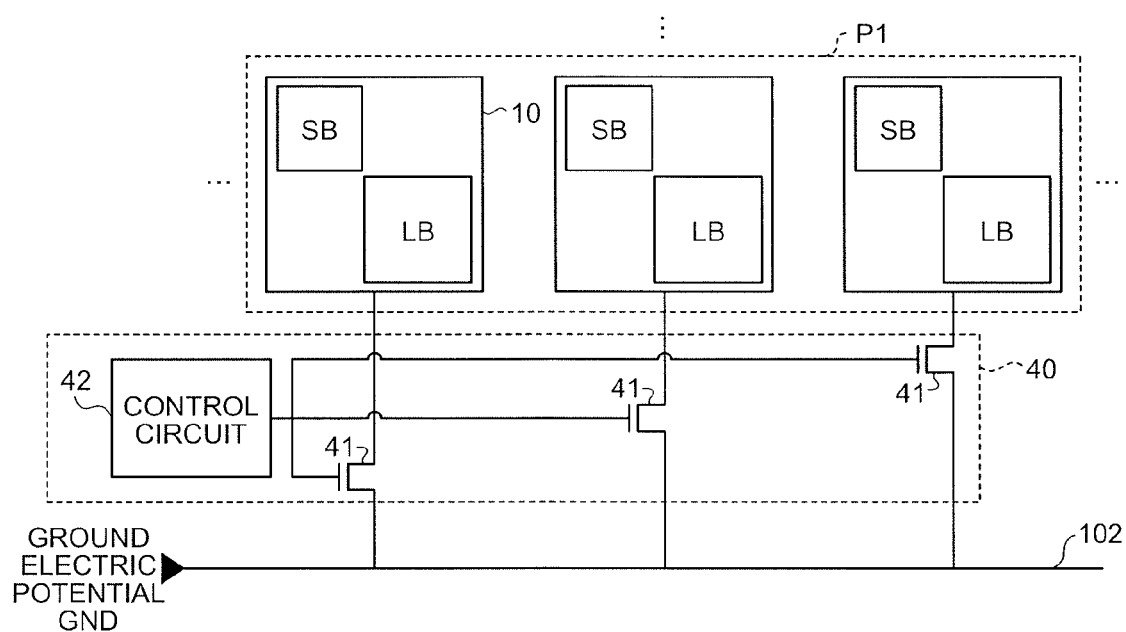
FIG. 25 is a diagram illustrating an example of the configuration of a power control circuit according to a modified example.

Furthermore, for example, as illustrated in FIG. 25, a configuration may be employed in which the switching elements 41 configured by the N-type MOSFETs are individually disposed between the three tiles 10 included in the set P1 and the ground line 102.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
    a first circuit group configured to include at least one first logic block;
    a second circuit group configured to include second logic blocks, the number of the second logic blocks being greater than the number of the first logic blocks; and
    an input-output unit configured to input input data to the first logic block or the second logic blocks and to output output data from the first logic block or the second logic blocks to an outside,
    wherein the first circuit group further includes:
    a first switching block configured to include a switch switching, in accordance with programmable control data, a connection of a wiring used for at least one of
        a connection of the first logic block with the input-output unit or a connection of a second logic block with the input-output unit;
        a connection between the first logic blocks; and
        a connection between the first logic block and the second logic block; and
    a first power control circuit configured to commonly control a start of power supply and a stop of the power supply with respect to the first logic block and the first switching block, and
    wherein the second circuit group further includes:
    a second switching block configured to include a switch switching, in accordance with programmable control data, a connection of a wiring used for at least one of
        a connection of the first logic block with the input-output unit or a connection of the second logic block with the input-output unit;
        a connection between the second logic blocks; and
        a connection between the first logic block and the second logic block; and
    a second power control circuit configured to commonly control a start of power supply and a stop of the power supply with respect to the second logic blocks and the second switching block.

2. The semiconductor integrated circuit according to claim 1, wherein the second circuit group is arranged at a position that is closer to the input-output unit that inputs the input data or outputs the output data than the first circuit group.

3. The semiconductor integrated circuit according to claim 2, further comprising:
    a third circuit group configured to include third logic blocks, the number of the third logic blocks being greater than the number of the first logic blocks, the number of the third logic blocks being smaller than the number of the second logic blocks; configured to be arranged at a position located farther from the input-output unit that inputs the input data or outputs the output data than the second circuit group; and configured to be arranged at a position closer to the input-output unit that inputs the input data or outputs the output data than the first circuit group,
    wherein the third circuit group further includes:
    a third switching block configured to include a switch switching, in accordance with programmable control data, a connection of a wiring used for at least one of
        a connection of one of the first logic block, the second logic block, and a third logic block with the input-output unit;
        a connection between the third logic blocks; and
        a connection of the first logic block with the third logic block or a connection of the second logic block with the third logic block; and
    a third power control circuit configured to commonly control a start of power supply and a stop of the power supply with respect to the third logic block and the third switching block.

4. The semiconductor integrated circuit according to claim 2, further comprising:
    a fifth circuit group configured to include fifth logic blocks, the number of the fifth logic blocks being smaller than the number of the second logic blocks; and configure to be arranged at a position located closer to the input-output unit that inputs the input data or outputs the output data than the second circuit group,
    wherein the fifth circuit group further includes: a fifth switching block configured to include a switch switching, in accordance with programmable control data, a connection of a wiring used for at least one of
        a connection of one of the first logic block, the second logic block, and a fifth logic block with the input-output unit;
        a connection between the fifth logic blocks; and
        a connection of the first logic block with the fifth logic block or a connection of the second logic block with the fifth logic block; and a fifth power control circuit configured to commonly control a start of power supply and a stop of the power supply with respect to the fifth logic block and the fifth switching block.

5. The semiconductor integrated circuit according to claim 4, wherein the operation probability is represented by the following equation:

$$f(D)=1/[\exp\{(D-\mu)/C\}+1]$$

wherein f(D) represents the operation probability of the logic block that is arranged at a position separated by a distance D from the input-output unit that inputs the input data or outputs the output data; μ represents a distance from the input-output unit in a case where the logic block is used in an order of closeness to the input-output unit; and C is a constant that represents the degree of easiness in separating the logic block from the input-output unit.

6. The semiconductor integrated circuit according to claim 2, wherein the logic block included in the second circuit group has an operation probability, which represents a possibility of being supplied with power and operated, higher than that of the logic block included in the first circuit group.

7. The semiconductor integrated circuit according to claim 1, wherein the first circuit group is arranged at a position closer to the input-output unit that inputs the input data or outputs the output data than the second circuit group.

8. The semiconductor integrated circuit according to claim 7, wherein there is no other circuit group including logic block between the input-output unit that inputs the input data or outputs the output data and the first circuit group.

9. The semiconductor integrated circuit according to claim 8, further comprising:

a fourth circuit group configured to include fourth logic blocks, the number of the fourth logic blocks being smaller than the number of the second logic blocks; and configure to be arranged at a position located farther from the input-output unit that inputs the input data or outputs the output data than the second circuit group, wherein the fourth circuit group further includes:

a fourth switching block configured to include a switch switching, in accordance with programmable control data, a connection of a wiring used for at least one of
 a connection of one of the first logic block, the second logic block, and the fourth logic block with the input-output unit;
 a connection between the fourth logic blocks; and
 a connection of the first logic block with a fourth logic block or a connection of the second logic block with the fourth logic block; and a fourth power control circuit configured to commonly control a start of power supply and a stop of the power supply with respect to the fourth logic block and the fourth switching block.

* * * * *